United States Patent [19]

Patel et al.

[11] Patent Number: 5,636,252
[45] Date of Patent: Jun. 3, 1997

[54] AUTOMATIC GAIN CONTROL OF RADIO RECEIVER FOR RECEIVING DIGITAL HIGH-DEFINITION TELEVISION SIGNALS

[75] Inventors: Chandrakant B. Patel, Hopewell, N.J.; Allen Limberg, Vienna, Va.

[73] Assignee: Samsung Electronics Co., Ltd., Kyungki-Do, Rep. of Korea

[21] Appl. No.: 573,454

[22] Filed: Dec. 15, 1995

Related U.S. Application Data

[63] Continuation-in-part of Ser. No. 237,896, May 4, 1994, Pat. No. 5,479,449, which is a continuation-in-part of Ser. No. 247,753, May 23, 1994.

[51] Int. Cl.[6] .................................................. H04L 27/08
[52] U.S. Cl. ........................... 375/345; 375/321; 348/729
[58] Field of Search ........................... 375/316, 345, 375/321; 455/234.1; 330/254, 129; 348/729

[56] References Cited

U.S. PATENT DOCUMENTS 5,241,566  8/1993  Jackson ........................... 375/321
5,418,815  5/1995  Ishikawa et al. .................. 375/321

*Primary Examiner*—Stephen Chin
*Assistant Examiner*—T. Ghebretinsae
*Attorney, Agent, or Firm*—Sughrue, Mion, Zinn, Macpeak & Seas

[57] ABSTRACT

Digital HDTV signals are exemplary of vestigial sideband (VSB) signals, which signals include a pilot carrier and sidebands generated in response to symbol codes descriptive of digital signals. A radio receiver for such VSB signals includes automatic gain control (AGC) circuitry that generates AGC signal by synchronously detecting the pilot carrier.

22 Claims, 14 Drawing Sheets

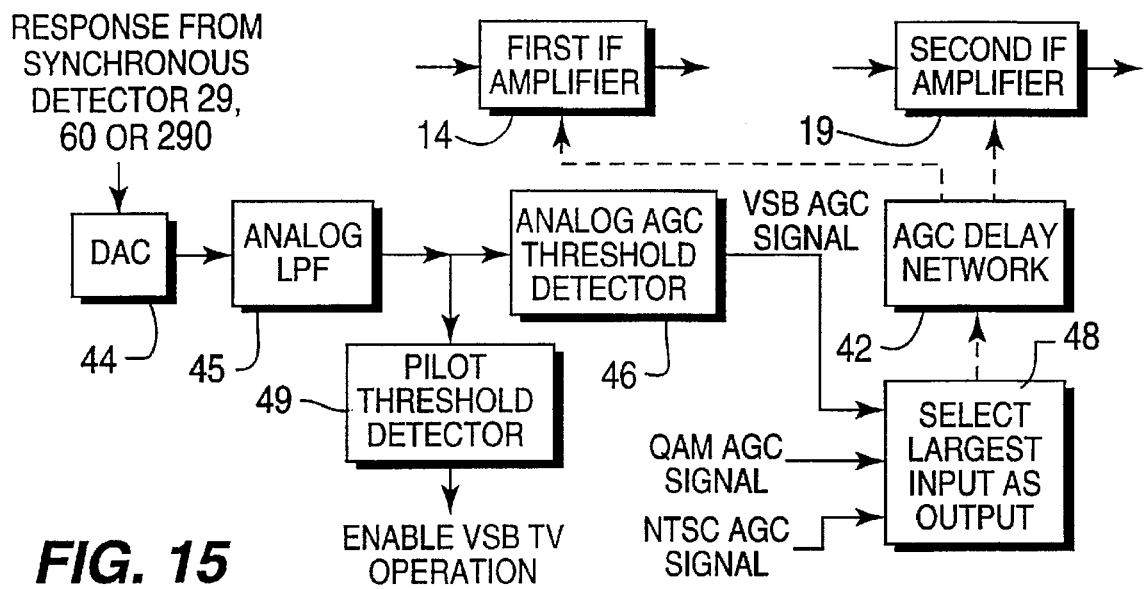
FIG. 15
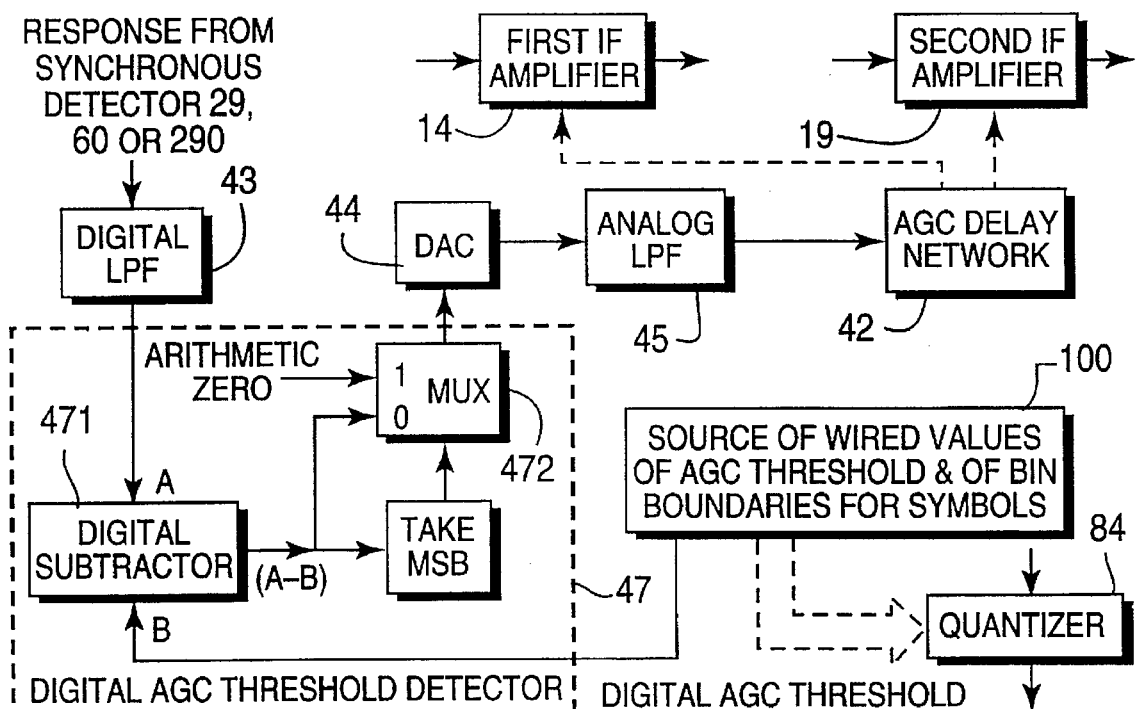
FIG. 16
FIG. 17

AUTOMATIC GAIN CONTROL OF RADIO RECEIVER FOR RECEIVING DIGITAL HIGH-DEFINITION TELEVISION SIGNALS

This is a continuation-in-part of allowed patent application Ser. No. 08/237,896 filed May 4, 1994 now U.S. Pat. No. 5,479,449, and of patent application Ser. No. 08/247,753 filed May 23, 1994.

The invention relates to digital high-definition television (HDTV) signal radio receivers and, more particularly, to the automatic gain control (AGC) of such receivers.

BACKGROUND OF THE INVENTION

Radio receivers for receiving HDTV signals are described by the inventors in the U.S. patent applications listed below, incorporated by reference herein, and commonly assigned herewith:

Ser. No. 08/237,896 filed 4 May 1994 and entitled DIGITAL VSB DETECTOR WITH BANDPASS PHASE TRACKER, AS FOR INCLUSION IN AN HDTV RECEIVER issued 26 Dec. 1995 as U.S. Pat. No. 5,479,449;

Ser. No. 08/243,480 filed 19 May 1994 and entitled DIGITAL VSB DETECTOR WITH BANDPASS PHASE TRACKER USING RADER FILTERS, AS FOR USE IN AN HDTV RECEIVER;

Ser. No. 08/247,753 filed 23 May 1994 and entitled DIGITAL VSB DETECTOR WITH FINAL I-F CARRIER AT SUBMULTIPLE OF SYMBOL RATE, AS FOR HDTV RECEIVER;

Ser. No. 08/266,751 filed 28 Jun. 1994 and entitled HDTV RECEIVER WITH IMAGINARY-SAMPLE-PRESENCE DETECTOR FOR QAM/VSB MODE SELECTION, issued 9 Apr. 1996 as U.S. Pat. No. 5,506,636; and Ser. No. 08/266,753 filed 28 Jun. 1994 and entitled RADIO RECEIVER FOR RECEIVING BOTH VSB AND QAM DIGITAL HDTV SIGNALS.

The invention described in these applications and in this disclosure are assigned to Samsung Electronics, Co., Ltd. pursuant to Employee Invention Agreements in effect as of the times these inventions were made.

In radio receivers for analog TV signals there is an interest in maintaining uniformity of amplitude response over a field and from field to field as well, since the amplitude response is directly used to control the intensity of light on a television viewing screen. In radio receivers for analog TV signals in which video carrier amplitude modulation decreases in energy with brighter signals, the horizontal sync pulses are the portions of the signal with largest excursion, so peak detection of these pulses is well suited to developing AGC voltages. Normally, the AGC in these receivers is quite "tight", which is to say that the level of sync tips in the video detector response is held reasonably constant over a wide range of signal strengths. When the video detector is an envelope detector there is a tendency for the AGC to "set up" on noise so that the level of sync tips in the video detector response is reduced with noise, which tendency to a degree may be desirable. When the video detector is a synchronous detector there is little if any tendency for the AGC to "set up" on noise.

In many radio receivers for amplitude-modulated or phase-modulated signals descriptive of digital symbols (such as QAM or PSK), "loose" AGC is developed simply using envelope detection of the IF signals. This "loose" AGC reduces intermediate-frequency signal levels responsive to received signals and their accompanying thermal background noise, so that clipping of modulation accompanied by such noise does not occur in the radio-frequency (RF) amplifier, intermediate-frequency (IF) amplifier, or detector portions of the radio receiver, or in the analog-to-digital converter(ADC). Strong impulse noise may be detected in an auxiliary receiver and used to gate a PIN switch that prevents the strong impulse noise from being applied as RF input signal to the principal radio receiver; this practice avoids ringing of the resonant circuits in the RF-amplifier and IF-amplifier portions of the radio receiver to curtail the lengths of time that digital data is disrupted by the strong impulse noise. In designs in which strong impulse noise is not gated out of RF input signal, the ringing resulting from the strong impulse noise may be clipped in an RF or IF amplifier, since data modulation is obliterated in any case. Preferably clipping is arranged to be symmetrical. In radio receivers for digital symbols there is less concern with maintaining uniformity of amplitude response over a field or over a sequence of fields than there is in an analog TV receiver, since the amplitude response is not directly used to control the intensity of light on a television viewing screen. Adaptive or "soft-decision" symbol decoding techniques which adjust symbol-level decoding ranges depending on received signals (plus noise) are customarily used when the symbol codes have multiple levels.

Alternatively, the symbol-level decoding ranges may have prescribed boundaries, and the baseband signal supplied from the final detector in the radio receiver may be adjusted in level using an automatically gain-controlled (AGCd) amplifier that has "tight" AGC. The AGCd amplifier can be a baseband amplifier in cascade connection after the final detector of the radio receiver, which final detector is an ADC in some designs. The baseband AGCd amplifier will also follow any ADC used to quantize the response of the final detector of the radio receiver if that final detector is of a type that supplies an analog response.

A background problem in digital HDTV receivers is being able to switch rapidly from one channel to another, so that a viewer can perform channel-to-channel selection without annoying delay when hunting for something he wishes to view. Symbol decoding is done using a trellis decoder and is preferably adaptive or "soft-decision" in nature. When a new channel is selected, there are delays associated with symbol synchronization, with adjusting the symbol-level ranges in the trellis decoder, and with the decoding taking place after trellis decoding, particularly the MPEG-2 decoding used to de-compress compressed digital data. The MPEG-2 decoders currently used have a one second or so delay associated with them, which is about all the delay that is tolerable during channel-to-channel selection. So it is very desirable to minimize the time required for adjusting the response of the final detector of the radio receiver and the extent of symbol-level ranges in the trellis decoder respective to each other. Prescribing the boundaries of the symbol-level decoding ranges and providing "tight" AGC of the IF-amplifier response supplied to the final detector of the radio receiver portion of the digital HDTV receiver is preferred by the inventors. This avoids any delay associated with adjusting the boundaries of the symbol-level decoding ranges because of having to wait for the radio receiver AGC system to settle. This also avoids any delay associated with the use of separate AGC systems for the radio receiver and for the symbol codes supplied from the final detector of that radio receiver. Tracking problems between two different systems for adjusting gain are also avoided.

The departures of the symbol code levels in the final detector response of the radio receiver, from closest midpoints in the symbol-level decoding ranges, can be detected in order to generate the AGC signal (or, alternatively, to adjust the boundaries of the symbol-level decoding ranges). There are especial characteristics of the data received by digital HDTV receivers that allow simpler development of AGC signals (or, alternatively, simpler adjustment of the boundaries of the symbol-level decoding ranges), however.

In the 6 MHz-bandwidth digital HDTV signals to be used in the United States, each data field contains 314 data lines, and the fields are consecutively numbered modulo-two in order of their occurrence. Each line of data starts with a line synchronization code group of four symbols having successive values of +S, −S, −S and +S. The value +S is one level below the maximum positive data excursion, and the value −S is one level above the maximum negative data excursion. The lines of data are each of 77.7 microsecond duration, and there are 832 symbols per data line for a symbol rate of about 10 megabits/second. The initial line of each data field is a field synchronization code group that codes a training signal for channel-equalization and multipath suppression procedures. The training signal is a 511-sample pseudo-random sequence (or "PR-sequence") followed by three 63-sample PR sequences. This training signal is transmitted in accordance with a first logic convention in the first line of each odd-numbered data field and in accordance with a second logic convention in the first line of each even-numbered data field, the first and second logic conventions being one's complementary respective to each other.

Developing AGC in an HDTV receiver proceeding from detection of line synchronization code group suggests itself by analogy to developing AGC in an analog TV receiver proceeding from detection of horizontal line synchronization pulses. In HDTV signals the data line synchronization code groups are not the portions of the signal with largest excursion, however, and code groups resembling line synchronization code groups can occur at times within data lines. So, for AGC purposes, detecting the amplitude of the data line sync pulse groups is not entirely analogous to detecting the amplitude of horizontal sync pulses in an analog TV signal. U.S. Pat. No. 5,410,368 issued 25 Apr. 1995 to G. Krishnamurthy et alii, entitled CARRIER ACQUISITION BY APPLYING SUBSTITUTE PILOT TO A SYNCHRONOUS DEMODULATOR DURING A START UP INTERVAL and assigned to Zenith Electronics Corp. describes the generation of AGC signals from match filter response to the data line sync pulse groups. The match filter exhibits peaks in its response when data line sync pulse groups occur, so AGC signals can be developed from these response peaks in a way analogous to the way AGC signals are developed in an analog TV receiver proceeding from horizontal line synchronization pulses.

Vestigial sideband (VSB) signals that will be used in terrestrial broadcast transmissions of HDTV signal in the United States employ twelve interleaved trellis codes, each a ⅔-rate trellis code with one uncoded bit, which interleaved trellis codes are transmitted as 8-level (3 bit) one-dimensional-constellation symbol coding. The VSB signals have their natural carrier wave, which would vary in amplitude depending on the percentage of modulation, suppressed. The natural carrier wave is replaced by a pilot carrier wave of fixed amplitude, which amplitude corresponds to a prescribed percentage of modulation. This pilot carrier wave of fixed amplitude is generated by introducing a direct (or "zero-frequency") component of shift into the modulating voltage applied to the balanced modulator generating the amplitude-modulation sidebands that are supplied to the filter supplying the VSB signal as its response.

If the eight levels of the symbol coding have normalized values of −7, −5, −3, −1, +1, +3, +5 and +7 in the carrier modulating signal, the pilot carrier has a normalized vale of 1.25. The normalized value of +S is +5, and the normalized value of −S is −5.

Since the pilot carrier wave is continuously transmitted together with VSB HDTV signals and has an amplitude that is a prescribed percentage of modulation, very good AGC signals can be developed by synchronously detecting the pilot carrier wave, the inventors point out. The synchronous detector response can be lowpass filtered to strongly select against noise accompanying the direct, or zero-frequency, component of synchronous detector response used for developing AGC signal. Strong selection against noise is considerably simpler to achieve than in AGC systems that base AGC on detecting envelope variations. The strong selection against noise that is possible makes "very tight" AGC possible. Since the amplitude of the pilot carrier wave is in direct proportion to changes in symbol code level, this "very tight" AGC can accurately control the symbol levels supplied to the symbol decoder so they are centered within prescribed symbol ranges.

Since the pilot carrier wave is continuously transmitted; and since data modulation has no direct, or zero-frequency, component; AGC time constants can be made substantially shorter than a data line interval when AGC signal is generated by narrowband synchronous detection of the pilot carrier. AGC is very quickly established.

SUMMARY OF THE INVENTION

The invention is embodied in certain of its aspects in methods for providing automatic gain control (AGC) to a radio receiver for vestigial sideband (VSB) signals including a pilot carrier and sidebands generated in response to symbol codes descriptive of digital signals, digital HDTV signals being exemplary of such VSB signals, which methods generate AGC signal by synchronously detecting the pilot carrier. In one such method synchronous detection of the pilot carrier is carried out by synchronously detecting the pilot carrier as accompanied by the sidebands generated in response to symbol codes descriptive of digital signals, the resulting wideband synchronous detection response is quantized for symbol decoding, the wideband synchronous detection response is also lowpass filtered for obtaining the substantially zero-frequency component thereof, automatic gain control signal is developed responsive to the amount that the substantially zero-frequency component exceeds a prescribed threshold value. In another such method synchronous detection of the pilot carrier is carried out by bandpass filtering to separate the pilot carrier by from the sidebands generated in response to symbol codes descriptive of digital signals, synchronously detecting the sidebands generated in response to symbol codes to obtain a wideband synchronous detection result that is quantized for symbol decoding, synchronously detecting the separated pilot carrier to obtain a narrowband synchronous detection result, and automatic gain control signal is developed responsive to the amount that the substantially zero-frequency component of the narrowband synchronous detection result exceeds a prescribed threshold value.

The invention is embodied in other of its aspects in a radio receiver for vestigial sideband (VSB) signals including a pilot carrier and sidebands generated in response to symbol codes descriptive of digital signals, digital HDTV signals being exemplary of such VSB signals, which radio receiver includes automatic gain control (AGC) circuitry that generates AGC signal by synchronously detecting the pilot carrier.

BRIEF DESCRIPTION OF THE DRAWINGS

FIG. 15 is a block schematic diagram of a modification that in yet further embodiments of the invention can be made to either of the AGC arrangements of FIGS. 12, 13 or 14 in a television receiver adapted for receiving at least one other type of television signal in addition to the type using a VSB signal encoding digital information in symbol form.

FIG. 16 is a block schematic diagram illustrating an aspect of the invention in which narrowband in-phase synchronous detection of the pilot carrier component of the VSB signal is used to regulate the boundaries of amplitude range bins for a quantizer in the symbol synchronizer, which can be done even when automatic gain control of the intermediate-frequency amplifiers is not controlled by the result of narrowband in-phase synchronous detection.

FIG. 17 is a block schematic diagram of an automatic gain control (AGC) arrangement for the FIG. 1 VSB signal receiver, which AGC arrangement is constructed in accordance with an embodiment of the invention. In the block schematic diagrams, clock or control signal connections are shown in dashed line, where it is desired to distinguish them from connections for the signals being controlled.

DETAILED DESCRIPTION OF THE PREFERRED EMBODIMENTS

Figure 1:
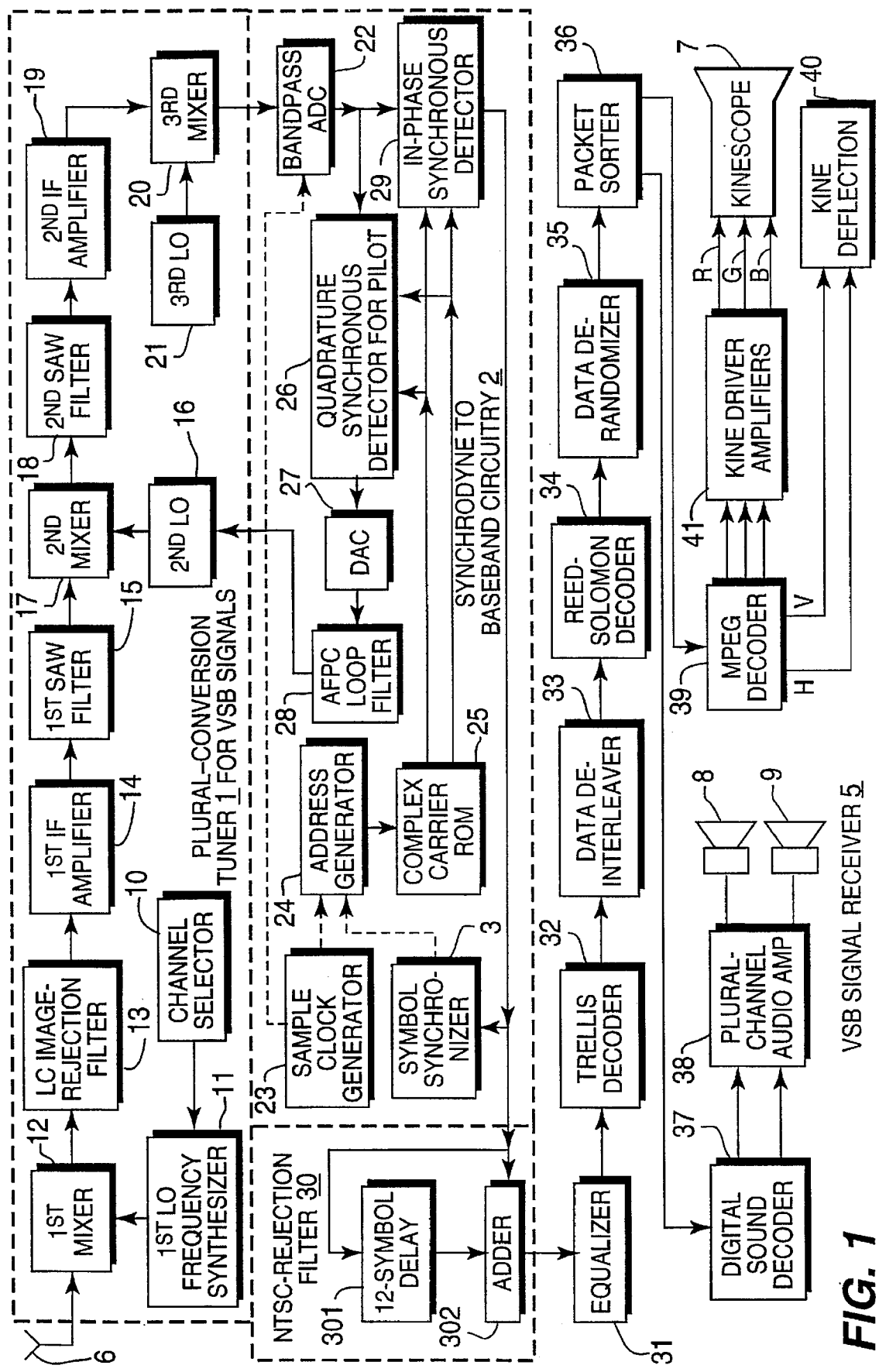
FIG. 1 is a general block schematic diagram of a digital HDTV receiver for VSB signal with a pilot carrier component, which digital HDTV receiver is of a type described in allowed patent application Ser. No. 08/247,753 filed 23 May 1994.

Before considering the use of automatic gain control in digital HDTV signal radio receivers, the nature of these receivers will be described in some detail.

Digital HDTV signal radio receivers have been proposed which use double-conversion in the tuner followed by synchronous detection. A frequency synthesizer generates first local oscillations that are heterodyned with the received television signals to generate first intermediate frequencies (e.g., with 920 MHz carrier). An LC filter selects these first intermediate frequencies from their image frequencies for amplification by a first intermediate-frequency amplifier, and the amplified first intermediate frequencies are filtered by a first surface-acoustic-wave (SAW) filter that rejects adjacent channel responses. The first intermediate frequencies are heterodyned with second local oscillations to generate second intermediate frequencies (e.g., with 38 MHz carrier), and a second SAW filter selects these second intermediate frequencies from their images and from remnant adjacent channel responses for amplification by a second intermediate-frequency amplifier. The response of the second intermediate-frequency amplifier is synchrodyned to baseband with third local oscillations of fixed frequency.

The third local oscillations of fixed frequency are supplied in 0°- and 90°-phasing, thereby implementing in-phase and quadrature-phase synchronous detection procedures. The in-phase synchronous detection result is eight-level coding of digital symbols when HDTV signals are broadcast, and the quadrature-phase synchronous detection result is nominally zero-valued. Separately digitizing in-phase and quadrature-phase synchronous detection results generated in the analog regime presents problems with regard to the synchronous detection results satisfactorily tracking each other after digitizing; Quantization noise introduces pronounced phase errors in the complex signal considered as a phasor. These problems are alleviated by performing the in-phase and quadrature-phase synchronous detection procedures in the digital regime.

By way of example, the in-phase and quadrature-phase synchronous detection procedures are implemented by sampling the response of the second intermediate-frequency amplifier at twice the Nyquist rate of the eight-level coding when digitizing. The successive samples are considered to be consecutively numbered in order of their occurrence; and odd samples and even samples are separated from each other to generate respective ones of the in-phase (or real) and quadrature-phase (or imaginary) synchronous detection results.

The eight-level coding in the digital in-phase synchronous detection result is filtered to remove co-channel interference from NTSC signals and is subjected to equalization filtering. The equalization filter response is supplied as input signal to a trellis decoder. The response of the trellis decoder is supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the HDTV program, and other selected packets are used to reproduce the video portions of the HDTV program.

Synchrodyning is the procedure of multiplicatively mixing a modulated signal with a wave having a fundamental frequency the same as the carrier of the modulated signal and lowpass filtering the result of the multiplicative mixing to recover the modulating signal at baseband, baseband extending from zero frequency to the highest frequency in the modulating signal. To implement the synchrodyning used in the in-phase and quadrature-phase synchronous detection procedures, the quadrature-phase synchronous detection results are used to develop automatic-frequencyand-phase-control (AFPC) signals for a controlled oscillator that generates the second local oscillations. The digital quadrature-phase synchronous detection result is low-pass filtered to generate an AFPC signal that adjusts the frequency and phase of the second local oscillations to minimize the amplitude of the quadrature-phase synchronous detection result. In practice however, this automatic frequency and phase control is inadequate in providing the desired degree of phase stability for the in-phase synchronous detection result. The adaptive equalization filtering of the digitized in-phase synchronous detection result can correct for static phase error in the synchrodyning used in the in-phase and quadrature-phase synchronous detection procedures, but the adaptive change in the filter coefficients of the equalization filtering is too slow to compensate for phase jitter in the AFPC feedback loop or for changes in phase error that occur during rapid changes in multipath reception of the HDTV signal.

Accordingly, a phase tracker is cascaded with the equalization filtering of the digitized in-phase synchronous detection result. The equalized in-phase synchronous detection result is supplied in digitized form to a Hilbert-transform finite-impulse-response filter. The response of this FIR filter and the equalized in-phase synchronous detection, as delayed to compensate for the latency of the Hilbert-transform FIR filter, are applied as real and imaginary input signals to a complex-number multiplier, to be multiplied by a complex-number multiplier signal for generating a complex-number product. A feedback loop ascertains the departure of the imaginary component of the complex-number product from zero to develop an error signal for adjusting the phase angle of the unit Euler vector used as the complex-number multiplier signal. The real and imaginary values of the unit Euler vector are drawn from a sin/cosine look-up table (LUT) stored in read-only memory (ROM) addressed by the output of an accumulator used for integrating the error signal. A problem with this phase tracker is that the Hilbert-transform FIR filter has to have many, many taps in order to provide the requisite 90° of phase shift at close to zero frequencies.

In the previously referred to patent application Ser. No. 08/237,896 the HDTV signal radio receivers described above are modified so the second local oscillations, which are heterodyned with the first intermediate frequencies to convert them to second intermediate frequencies, are of a fixed frequency. Accordingly, phase jitter in the AFPC feedback loop of a controlled oscillator is eliminated as a problem in the generation of the second local oscillations. The second local oscillations are at a fixed frequency offset from the frequency of the carrier for the second intermediate frequencies. The second local oscillations therefore heterodyne with the first intermediate frequencies to downconvert them to second intermediate frequencies, rather than synchrodyning with the first intermediate frequencies to downconvert them to baseband. The second intermediate frequencies are then digitized with a bandpass, rather than baseband, analog-to-digital converter; and the rest of the detection procedures are carried out in the digital regime. The second intermediate frequencies will still exhibit changes in phase error that occur during rapid changes in multipath reception of the HDTV signal, so a phase tracker is still desirable. The phase tracker is implemented at the second intermediate frequencies during complex synchronous detection, and is therefore implemented before equalization filtering, rather than the phase tracker being implemented after complex synchronous detection and equalization filtering as previously done. The phase tracker is a bandpass phase tracker, rather than the baseband (or lowpass) phase tracker used in the prior-art receiver.

The in-phase and quadrature-phase sampling procedures used in the bandpass phase tracker are adapted from ones previously used for complex synchronous detection of digitized bandpass signals having symmetrical sideband structures. HDTV signals for over-the-air broadcasting are vestigial sideband (VSB) amplitude-modulation signals, rather than double sideband (DSB) amplitude-modulation signals, and have asymmetrical sideband structures. The complex synchronous detection of the HDTV signals, used for developing error signal in the bandpass phase tracker, must be sufficiently restricted in bandwidth that response is to a symmetrical sideband structure contained within the asymmetrical sideband structure of the VSB signal. The synchronous detection of the HDTV signals to recover the eight-level (or 16-level) VSB coding is not so restricted in bandwidth.

The in-phase and quadrature-phase sampling procedures used in the bandpass phase tracker are generally similar to those described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982), for example. Rice and Wu point out that the bandpass signals need to be sampled before digitization at or above the Nyquist rate, as determined by the bandwidth of the bandpass signal and not by the highest frequency component of the bandpass signal. Quadrature-phase synchronous detection is performed using a Hilbert-transform FIR filter on the digitized bandpass signals; in-phase synchronous detection is performed after compensating delay equal to the latency time of the Hilbert-transform FIR filter. Rice and Wu point out that performing complex synchronous detection on digitized bandpass signals has the advantage that the direct components introduced by the mixer are suppressed by the bandpass filter and do not affect digitization. In the complex synchronous detection of digitized VSB signals in bandpass form, the direct component of the complex synchronous detection result arising from the partially suppressed carrier wave is unaffected by the direct components introduced by the mixer.

Hilbert transforming digitized bandpass signals, rather than digitized baseband signals, has other advantages. The Hilbert-transform FIR filter no longer has to provide 90° of phase shift at close to zero frequencies, where very long delay is required for providing 90° of phase shift. The Hilbert-transform FIR filter only has to provide 90° of phase shift above a megahertz or two, where delay requirements are modest, up to a frequency of seven to eight megahertz. The relatively small ratio between the uppermost response frequency and the lowermost response frequency required of the filter keeps the number of taps required in the filter relatively low.

In the previously referred to patent application Ser. No. 08/247,753 an automatic phase and frequency control (AFPC) signal is developed in the digital circuitry following the analog-to-digital converter and is used to control the frequency and phase of one of the local oscillators in the tuner. This is done so as to lock the pilot carrier of the final intermediate-frequency (IF) signal in frequency and phase to a multiple of the symbol clock frequency. Using a fixed-frequency third local oscillator, and controlling the frequency and phase of the oscillations the second local oscillator provides, is preferred in that alignment of the second IF signal with the second SAW filter can be readily assured. Controlling the frequency and phase of one of the local oscillators in the tuner so that the pilot carrier of the final intermediate-frequency (IF) signal is locked in frequency and phase to a multiple of the symbol clock frequency is advantageous in that the symbol clocking can be made to exhibit a high degree of time stability. The AFPC of the IF signals to remove pilot carrier variations during changes in multipath conditions corrects variations of symbol timing in the received signals as well. These corrections are made responsive to a pilot signal of substantial energy that is continuously transmitted. Tracking the changes in pilot phasing is accordingly much more accurate than attempting to track changes in symbol phasing, in which latter form of tracking the formidable problems of accurately defining inter-symbol transitions on a short-term basis have to be dealt with. Since variations of symbol timing in the received signals are corrected by correcting pilot phasing when the pilot carrier is locked in frequency and phase to a multiple of the symbol clock frequency, the speed-of-tracking requirements on the symbol synchronizer are substantially reduced.

FIG. 1 shows a signal receiver 5 as disclosed in patent application Ser. No. 08/247,753, used for receiving VSB digital HDTV signals from a broadcast receiving antenna 6. This receiver 5 recovers red (R), green (G) and blue (B) drive signals for a kinescope 7 and recovers stereophonic sound signals for driving left and right loudspeakers 8 and 9. Alternatively, the VSB signal receiver 5 can be connected for receiving digital HDTV signals from a narrowcast receiving antenna or from a cablecast transmission system. A different display device may be used instead of the kinescope 7, and the sound recovery system may be different, consisting of but a single audio channel or being more elaborate than a simple stereophonic reproduction system.

A tuner 1 comprising elements 11–21 selects one of channels at different locations in the frequency band for the received VSB signals, such as the digital HDTV signals captured by the broadcast receiving antenna 6, and performs plural frequency conversion of the selected channel to a final intermediate-frequency signal in a final intermediate-frequency band. More particularly, a channel selector 10 designed for operation by a human being determines the frequency of first local oscillations that a frequency synthesizer 11, which functions as a first local oscillator, furnishes to a first mixer 12 for heterodyning with received signals as supplied from the broadcast receiving antenna 6 or other digital HDTV signal source. The first mixer 12 upconverts the received signals in the selected channel to prescribed first intermediate frequencies (e.g., with 920 MHz carrier) and an LC filter 13 is used to reject the unwanted image frequencies that accompany the upconversion result supplied from the first mixer 12. The first intermediate frequencies resulting from the upconversion are supplied as input signal to a first intermediate-frequency amplifier 14, which supplies amplified first intermediate frequencies for driving a first surface-acoustic-wave (SAW) filter 15. The upconversion to the rather high-frequency first intermediate frequencies facilitates SAW filtering having a large number of poles and zeroes. Second local oscillations from a second local oscillator 16 are supplied to a second mixer 17 for heterodyning with the response of the first SAW filter 15, to generate second intermediate frequencies (e.g., with 41 MHz carrier). A second SAW filter 18 is used for rejecting the unwanted image frequencies that accompany the upconversion result supplied from the second mixer 17. During the period of transition from NTSC television transmissions to digital television transmissions, the second SAW filter 18 will usually contains traps for sound and video carriers of adjacent-channel NTSC television transmissions. The response of the second SAW filter 18 is supplied as input signal to a second intermediate-frequency amplifier 19, the amplified second intermediate-frequency signal response of which is supplied as input signal to a third mixer 20 there to be heterodyned with oscillations from a third local oscillator 21. The plural-conversion tuner 1 as thusfar described resembles those previously proposed by others, except that the frequency of the oscillations from the third local oscillator 21 is chosen such that the third mixer 20 supplies a third intermediate-frequency signal response with the vestigial sideband extending down to a frequency of one to two MHz and with the full sideband extending up to a frequency of seven to eight MHz, rather than a baseband signal with zero-frequency carrier. The third intermediate-frequency signal is locked to a submultiple of symbol frequency. The third intermediate-frequency signal response is the final intermediate-frequency output signal of the tuner 1 supplied to circuitry 2 for synchrodyning VSB signals to baseband.

An analog-to-digital converter (ADC) 22 at the input of the circuitry 2 samples the final intermediate-frequency output signal of the tuner 1, the duration of each of the analog samples being no longer than a half cycle of the highest final intermediate frequency so as to avoid undesirable aliasing, and digitizes the samples to digital samples having 10-bit resolution, or so. The lowpass filter that is included, per customary practice, in the ADC 22 suppresses the high-frequency image of the third intermediate-frequency signal response from the third mixer 20. The second SAW filter 18 has already restricted the bandwidth of the third intermediate-frequency signals presented to the ADC 22 to be digitized, so the ADC 22 functions as a bandpass analog-to-digital converter. The sampling rate used by the ADC 22 during digitization is at least the Nyquist rate for the bandwidth of the bandpass signal, which is 6 MHz for HDTV signals. In practice the inventors prefer a sampling rate of twice the symbol rate for the VSB HDTV signals or about $21 \cdot 10^6$ samples per second. A sample clock generator 23 generates the sampling pulses at a nominal 21 MHz rate, which rate is controlled in response to symbol frequency components of the received VSB signal. The sample clock generator 23 preferably includes a crystal oscillator capable of frequency control over a relatively narrow range for generating cissoidal oscillations at a multiple of symbol rate. A symmetrical clipper or limiter generates a square-wave response to these cissoidal oscillations, which is used as clock signal by the ADC 22 as a step in the digitization procedure which follows the initial step of filtering to limit bandwidth. The frequency of the cissoidal generated by the crystal oscillator in the sample clock generator 23 can be determined by an automatic frequency and phase control (AFPC) signal developed in response to symbol frequency components of the received VSB signal, for example, as will be described in detail further on in this specification when describing FIG. 11 of the drawing.

An address generator 24, as will be described in detail further on in this specification, when describing FIG. 12 of the drawing, includes an address counter 241 that counts pulses applied thereto from the sample clock generator 23 as an initial step in generating read-only memory addressing for read-only memory (ROM) 25. The address count from the address counter 241 is combined with a symbol phase correction in a digital adder 243, to generate read-only memory addressing for the ROM 25. The ROM 25 stores sine Φ and cosine Φ functions, where Φ is a radian measure related to address count. The sine Φ and cosine Φ functions concurrently read from the ROM 25 responsive to each sequential address from the address generator 24 are used to construct in-phase and quadrature-phase descriptions of the complex VSB carrier of the final IF signal. When the frequency of the VSB carrier of the final IF signal is at a submultiple of symbol frequency in a VSB signal receiver, the symbol phase correction exhibits substantially no change from cycle to cycle of the scanning of the read-only memory addresses. This permits AFPC of the VSB carrier of the final IF signal to be done fairly rapidly without the need for symbol phase correction being done at so rapid a rate. That is, the required symbol phase correction is a static correction that adjusts the relative phasing of the VSB carrier of the final IF signal with the submultiple of the sample clock. The symbol phase correction is not required to be a dynamic correction that follows changes in the sample clock timing on an absolute basis. This is why AFPC of the IF signals to remove pilot carrier variations during changes in multipath conditions can correct variations of symbol phasing in the received signals as well, when the VSB carrier of the final IF signal is locked to a submultiple of symbol frequency.

A quadrature-phase synchronous detector 26 synchronously detects, in accordance with the quadrature-phase description of the complex VSB carrier of the final IF signal constructed from ROM 25 read-out, at least the pilot frequency component of the digitized final IF signal supplied to the detector 26 from the ADC 22. The digital output signal from the quadrature-phase synchronous detector 26 is converted to an analog signal by a digital-to-analog converter 27, and the resulting analog signal is lowpass filtered by a lowpass filter 28 to generate an automatic frequency and phase control (AFPC) signal for one of the local oscillators 11, 16 or 21 in the tuner 1. The lowpass filter 28 is sufficiently narrowband that the AFPC signal responds just to least the pilot frequency component of the digitized final IF signal supplied to the detector 26, and the detector 26 may further include narrow bandpass filtering for selecting for synchronous detection just the pilot frequency component of the digitized final IF signal supplied to the detector 26. Preferably, as shown in FIG. 1, the AFPC signal from the filter 28 is applied to the second local oscillator 16 for controlling the frequency and phase of its oscillations. The application of the AFPC signal to one of the local oscillators 11, 16 or 21 in the tuner 1 completes the connections by which the pilot carrier of the final intermediate-frequency (IF) signal is locked in frequency and phase to a submultiple of the symbol clock frequency.

An in-phase synchronous detector 29 synchronously detects, in accordance with the in-phase description of the complex VSB carrier of the final IF signal constructed from ROM 25 read-out, the digitized final IF signal supplied to the detector 29 from the ADC 22. The detector 29 supplies a fullband response to the VSB signal, as the baseband response of the circuitry 2 for synchrodyning VSB signals to baseband. Details of various ways to construct the synchrodyne circuitry 2 are described further on in this specification with reference to FIGS. 2, 3, 4, 5, 6, 7, 8 and 9 of the drawing.

Sampling at twice the symbol rate for the VSB HDTV signals is done to accommodate a symbol synchronizer 3 that responds to the samples from the in-phase synchronous detector 29, for synchronizing the sampling by the ADC 22 with the symbol rate, so as to maximize the "eye" response. The symbol synchronizer 3 shown in FIG. 1 does not control the frequency of oscillations generated in the sample clock generator, but instead just controls the relative phasing of the sampling of the ADC 22 with respect to the complex carrier wave read from the ROM circuitry 25. As will be described in detail further on in this specification, when describing FIG. 12 of the drawing, the address generator 24 can include, in addition to the address counter 241, a digital adder 243 for combining the integrated-over-time phase error signal generated by the symbol synchronizer 3 with the address count from the address counter 241, thus to generate the addresses for the ROM 25. This procedure permits precise phase adjustment of the sine $\Phi$ and cosine $\Phi$ functions concurrently read from the ROM 25.

The baseband response of the synchrodyne circuitry 2 is supplied to an NTSC-rejection filter 30 for suppressing co-channel interference from NTSC signals, to be applied as input signal to a clocked delay line 301 and as a first summand input signal to a two-input digital adder 302. The clocked delay line 301 supplies a response to its input signal after a delay equal to twelve symbol epochs, which delayed response is applied to the digital adder 302 as its second summand input signal. The clocked delay line 301 and the digital adder 302 in the NTSC-rejection filter 30 cooperate so as to suppress co-channel interference from NTSC signals. The NTSC-rejection filter 30, which is a comb filter, is required as long as NTSC signals are being transmitted over the same channel allocations as digital HDTV signals. The filter 30 suppresses the NTSC luminance carrier and its lower-frequency sidebands containing synchronizing information, very strongly rejects the color subcarrier, suppresses the chrominance sidebands, and suppresses the FM audio carrier. The filter 30 supplies a fifteen-coding-level signal to an equalizer 31 in response to the eight-coding-level digital in-phase synchronous detection result from the detector 23. Though not explicitly shown the input signal to the equalization filter 31 is decimated 2:1 to reduce sample rate to symbol rate. The equalization filter response is supplied from the equalizer 31 as input signal to a trellis decoder 32, which performs the symbol decoding that recovers the digital data stream. The equalizer 31 provides equalization filtering that generates an adjusted amplitude response to the plural-level coding as applied to the trellis decoder 32, which adjusted amplitude response minimizes symbol error resulting from inter-symbol interference.

Although not explicitly shown in FIG. 1, preferably circuitry is provided in the VSB signal receiver 5 to sense when there is co-channel interference from NTSC signal, to by-pass the filter 30 when no co-channel interference from NTSC signal is sensed, and to adjust symbol decoding ranges in accordance with the number of coding levels to be expected. There is less likelihood of the occurrence of erroneous decisions as to symbol identity when eight coding levels have to be discerned than when fifteen coding levels have to be discerned. Although data synchronization circuitry is not explicitly shown in FIG. 1, one skilled in the digital HDTV art will understand that the VSB signal receiver 5 includes circuitry for determining when data fields and data lines occur to provide the basis for timing data de-interleaving. Data field synchronization circuitry takes its input signal from the output port of the equalizer 31, supposing the equalizer 31 is of the type preferred by the inventors, which type makes feedback adjustments of amplitude response dependent on the response of the equalizer 31 to a ghost-cancellation reference signal. The beginning of data fields are signaled by a pseudo-random pulse train that serves as a ghost-cancellation reference signal for the equalizer 31. Data line synchronization circuitry that detects the occurrences of the symbol code sequence signaling the beginning of data lines as they occur in the equalizer 31 response, rather than as they occur in the equalizer 31 input signal, is preferred by the inventors. Such data line synchronization circuitry can use the same circuitry for deciding coding levels as the trellis decoder 32 uses for symbol decoding.

The data response of the trellis decoder 32 is supplied as input signal to a data de-interleaver 33, and the de-interleaved data are supplied from the data de-interleaver 33 to a Reed-Solomon decoder 34. Error-corrected data are supplied from the Reed-Solomon decoder 34 to a data de-randomizer 35 which regenerates packets of data for a packet sorter 36. The packet sorter 36 sorts packets of data for different applications, responsive to header codes in the successive packets of data. Packets of data descriptive of the audio portions of the HDTV program are applied by the packet sorter 36 to a digital sound decoder 37. The digital sound decoder 37 supplies left-channel and right-channel stereophonic sound signals to a plural-channel audio amplifier 38 that drives the plurality of loudspeakers 8, 9. Packets of data descriptive of the video portions of the HDTV program are applied by the packet sorter 36 to an MPEG decoder 39. The MPEG decoder 39 supplies horizontal (H) and vertical (V) synchronizing signals to kinescope deflection circuitry 40 that provides for the raster scanning of the viewing screen of the kinescope 7 or other display device. The MPEG decoder 39 also supplies signals to the kinescope driver amplifiers 41 for applying amplified red (R), green (G) and blue (B) drive signals to the kinescope 7 or other display device.

Figure 2:
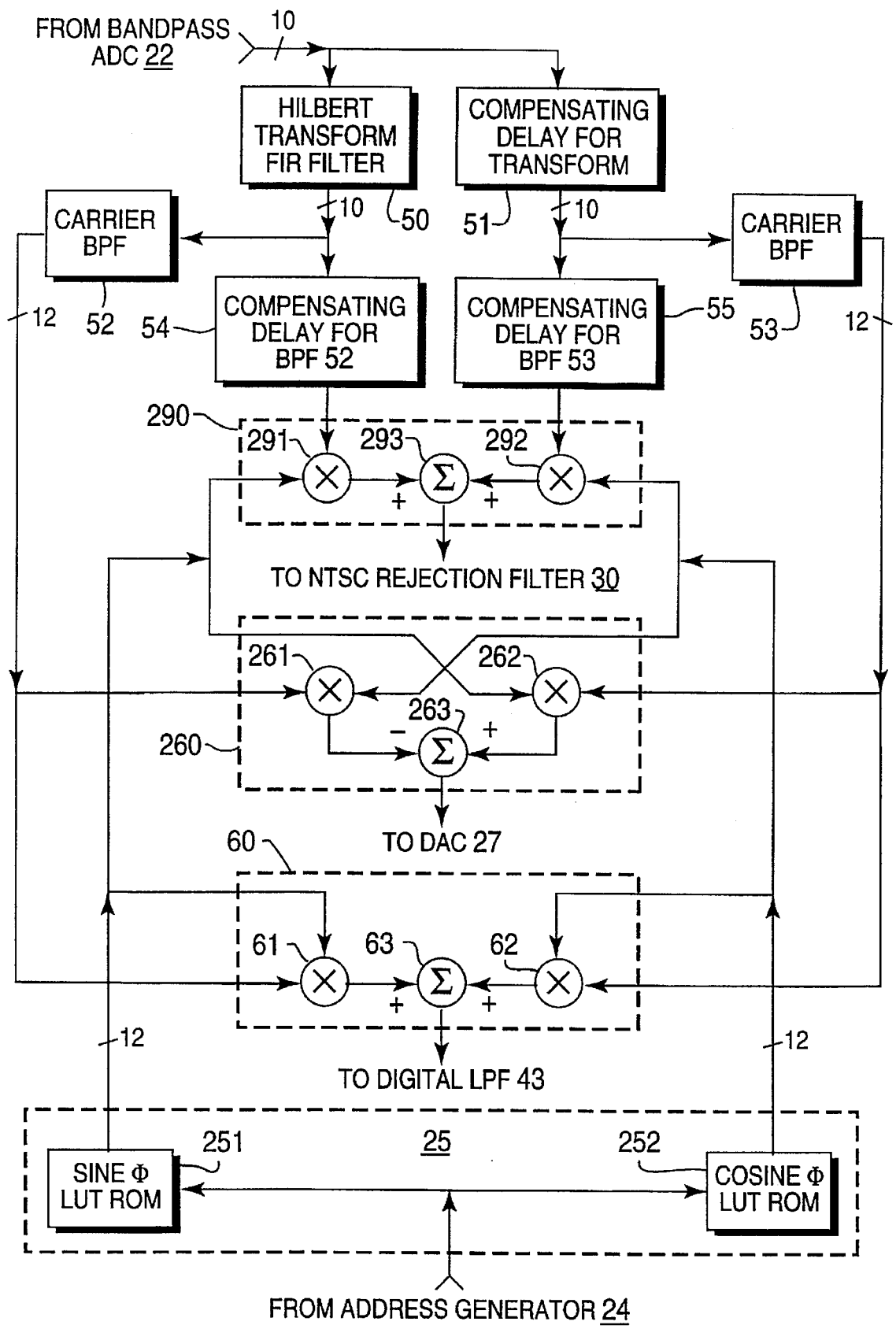
FIGS. 2, 3, 4, 5, 6, 7, 8 and 9 are block schematic diagrams of different configurations that the digital circuitry for synchrodyning symbols to baseband can take in various specific embodiments of the FIG. 1 digital HDTV receiver.

FIG. 2 shows the form portions of the synchrodyne circuitry 2 of FIG. 1 can take. FIG. 2 depicts a particular species 260 of the in-phase synchronous detector 26 shown generically in FIG. 1; and FIG. 2 further depicts a particular species 290 of the quadrature-phase synchronous detector 29 shown generically in FIG. 1. The digitized final IF signal from the analog-to-digital converter 22 is supplied as input signal to an FIR digital filter 50 providing a Hilbert transform of the third mixer 20 response. The digitized final IF signal from the ADC 22 is also supplied as input signal to a digital delay line 51, which delay line 51 provides compensating delay equal to the latency of the digital filter 50. The responses of the digital filter 50 and of the digital delay line 51 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filter 50 and of the digital delay line 51. The responses of the digital filter 50 and of the digital delay line 51 are supplied as input signals to digital delay lines 54 and 55, which provide respective compensating delays equal to the latency times of carrier bandpass filters 52 and 53, respectively.

The complex carrier ROM 25 is shown in FIG. 2 to include a component ROM 251, which stores a carrier wave sine Φ look-up table for supplying 12-bit multiplicands to the digital multipliers 262 and 291, and to include a component ROM 252, which stores a carrier wave cosine Φ look-up table for supplying 12-bit multiplicands to the digital multipliers 292 and 261. The plural-conversion tuner 1 preferably heterodynes the carrier of the VSB signal to the lower-frequency portion of the band of final IF signal frequencies supplied to the ADC 22, rather than the higher-frequency portion of that band, because the sine Φ and cosine Φ_ multiplicands are then supplied from the ROMs 251 and 252 with a greater number of samples per 2π radians of Φ, which provides higher angular resolution in the consecutive carrier wave samples. A number of tricks relying on symmetries in the sine and cosine functions are known to skilled digital designers for reducing the amount of ROM required for sine Φ and cosine Φ table look-up, and the ROM circuitry 25 can be modified to use such reduced-ROM designs. Arrangements where the sine Φ and cosine Φ signals are accumulated in accordance with sin (A+B)=sin A cos B+cos A sin B and with cos (A+B)=cos A cos B−sin A sin B trigonometric formulae respectively can be used for generating the complex carrier wave, rather than reading from ROM.

The quadrature-phase synchronous detector 260 comprises digital multipliers 261 and 262 for multiplying the responses of the carrier bandpass filters 52 and 53 by the cosine and the sine of the carrier wave, respectively, and a digital subtractor 263 for subtracting the product signal of the digital multiplier 261 from the product signal of the digital multiplier 262. That is, the complex digital description of separated pilot carrier wave furnished by the carrier bandpass filters 52 and 53 is multiplied by the complex digital description of the quadrature-phase carrier wave. Since it is known in advance that the real term of the complex product will invariably be zero-valued, or substantially so, the digital multipliers and adder that would be required to generate the real term are dispensed with. The difference output signal from the subtractor 263 provides an unfiltered digital AFPC signal for application to the DAC 27. The application of the unfiltered digital AFPC signal to the DAC 27 may be a direct one, made by simple wired connection for each bit of the digital difference from the subtractor 263, or it can include some digital filtering, such as circuitry for averaging samples over time.

The in-phase synchronous detector 290 for the complex signal supplied from the digital delay lines 54 and 55 comprises digital multipliers 291 and 292 for multiplying the responses supplied from the delay lines 54 and 55 by the sine and the cosine of the carrier wave, respectively, and a digital adder 293 for summing the product signals from the digital multipliers 291 and 292. Since it is known in advance that the imaginary term of the complex product will invariably be zero-valued, or substantially so, the digital multipliers and subtractor that would be required to generate the imaginary term are dispensed with. The in-phase synchronous detector 290 output signal, which is supplied as the sum signal from the adder 293, is applied to the NTSC-rejection filter 30 as its input signal.

Figure 3:
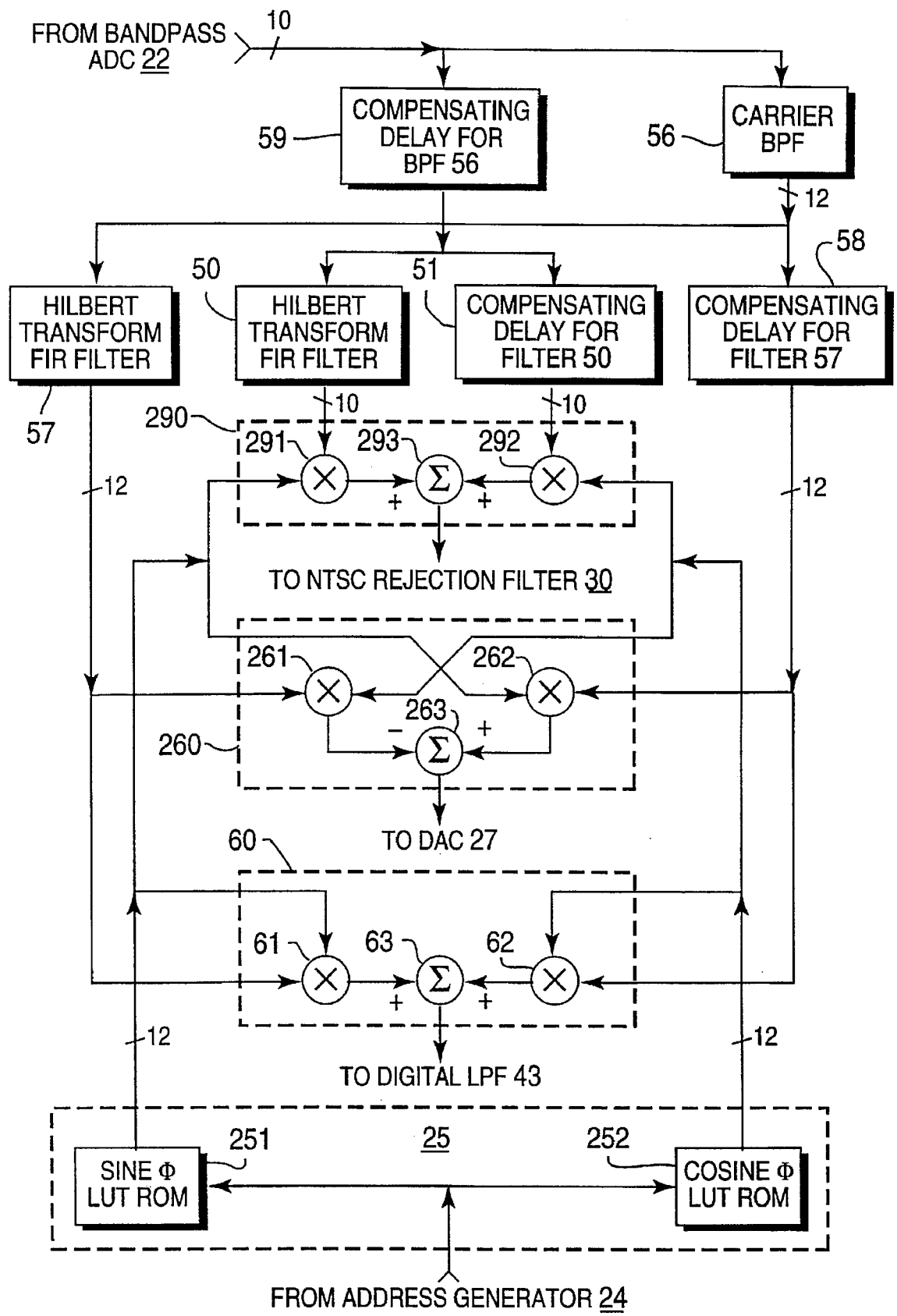

Another in-phase synchronous detector 60 just for the complex pilot carrier wave comprises digital multipliers 61 and 62 for multiplying the responses of the carrier bandpass filters 52 and 53 by the sine and the cosine of the locally generated carrier wave, respectively, and a digital adder 63 for summing the product signals from the digital multipliers 61 and 62. Since it is known in advance that the imaginary term of the complex product will invariably be zero-valued, or substantially so, the digital multipliers and subtractor that would be required to generate the imaginary term are dispensed with. The narrowband in-phase synchronous detector 60 output signal is available for averaging to generate a DC in-phase synchronous detection result, as will be described in detail further on in this specification with reference to FIG. 12 of the drawing FIG. 3 shows another form portions of the synchrodyne circuitry 2 can take, which form differs from that shown in FIG. 2 in the following respects. The narrowband carrier bandpass filters 52 and 53 are dispensed with, in favor of a single narrowband carrier bandpass filter 56 receiving the digitized final IF signal from the ADC 22 as its input signal and selecting a digitized carrier wave therefrom for its response. The filter 56 response is supplied as input signal to an FIR digital filter 57 providing a Hilbert transform of the filter 56 response. The filter 56 response is also supplied as input signal to a digital delay line 58, which provides compensating delay equal to the latency of the digital filter 56. The connections to the quadrature-phase synchronous detector 260 are altered so that the digital multipliers 261 and 262 multiply the responses of the digital filter 57 and of the digital delay line 58, respectively, rather than the responses of the carrier bandpass filters 52 and 53.

A delayed response to the digitized final IF signal from ADC 22, which delayed response is supplied by a digital delay line 59, is applied as input signal to the FIR digital filter 50 and to the digital delay line 51. The connections to the full-band in-phase synchronous detector 260 are altered so that the responses of the FIR digital filter 50 and the digital delay line 51 are applied directly to the digital multiplier 291 and to the digital multiplier 292 as their respective multiplicand signals. The digital delay line 59 provides compensating delay for the latency of the carrier bandpass filter 56 in the responses of both the filter 50 and the delay line 51. The single delay line 59 in cascade connection before the filter 50 and the delay line 51 provides the same responses as the two delay lines 54 and 55 connected in respective cascade connections after the filter 50 and the delay line 51, per FIG. 2, do.

The connections to the narrowband in-phase synchronous detector 60 are altered so that the digital multipliers 61 and 62 multiply the responses of the digital filter 57 and of the digital delay line 58, respectively, rather than the responses of the carrier bandpass filters 52 and 53.

Figure 4:
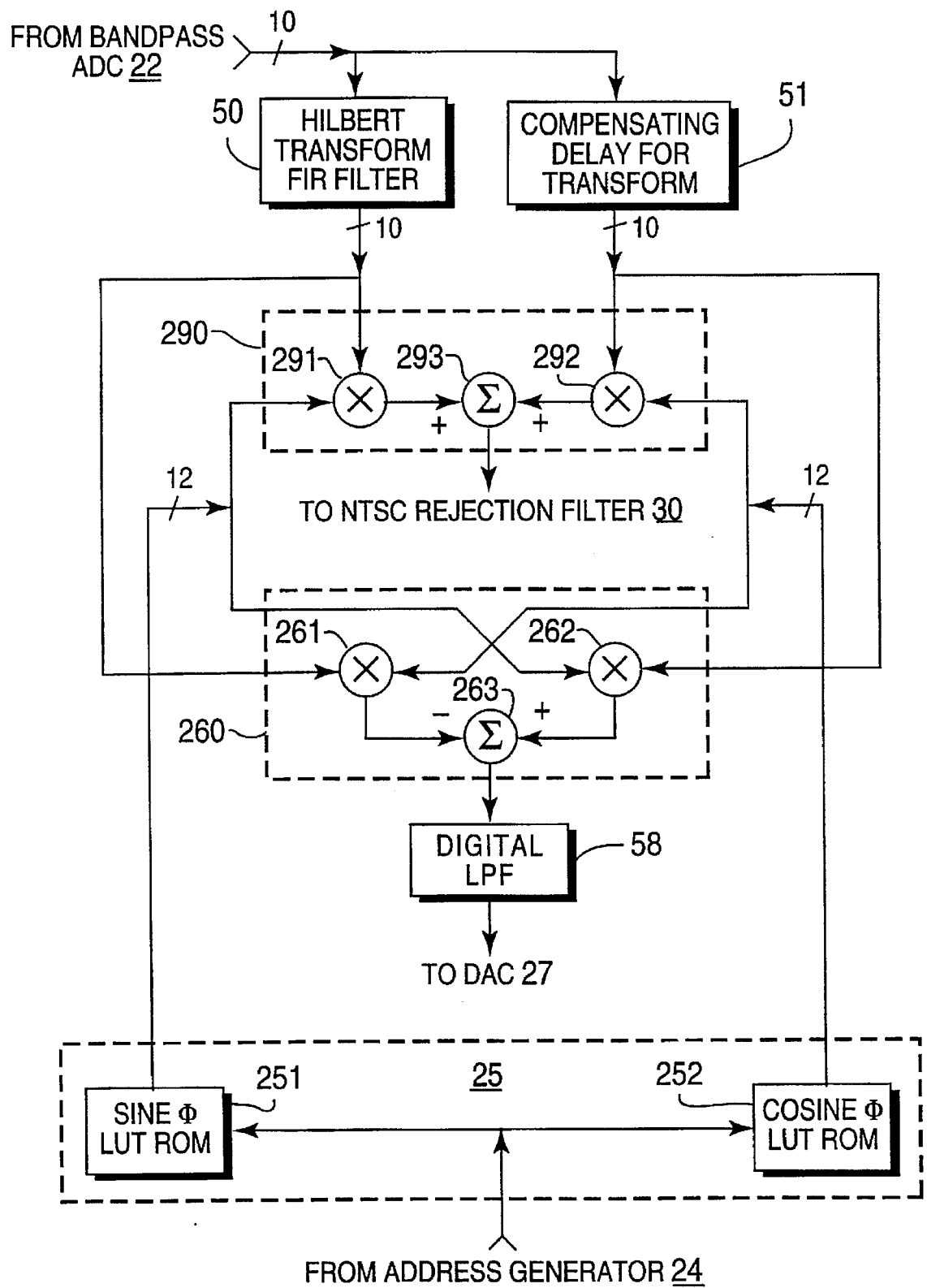

FIG. 4 shows another form portions of the synchrodyne circuitry 2 can take, which form differs from that shown in FIG. 2 in the following respects. The carrier bandpass filters 52 and 53 are each replaced by a respective wired connection. The digital delay lines 54 and 55, which provide respective compensating delays equal to the latency times of carrier bandpass filters 52 and 53 in FIG. 2, are each replaced by a respective wired connection. The quadrature-phase synchronous detector 260 is operated relatively wideband, with the AFPC signal attributable to the carrier wave being heterodyned to zero or close-to-zero frequency being selected from the sum output signal of the adder 263 using a low-pass digital filter 58. The low-pass filter 58 is chosen to have a cut-off frequency many times lower than symbol rate, so that frequencies associated with groups of successive similar symbols are rejected. The randomization of data as a preliminary step before symbol coding at the transmitter limits the number of successive similar symbols likely to occur, which facilitates lowpass filtering after quadrature-phase synchronous detection to recover AFPC signal. The randomization of data also facilitates bandpass filtering before quadrature-phase synchronous detection to recover AFPC signal per FIGS. 2 or 3.

Figure 5:
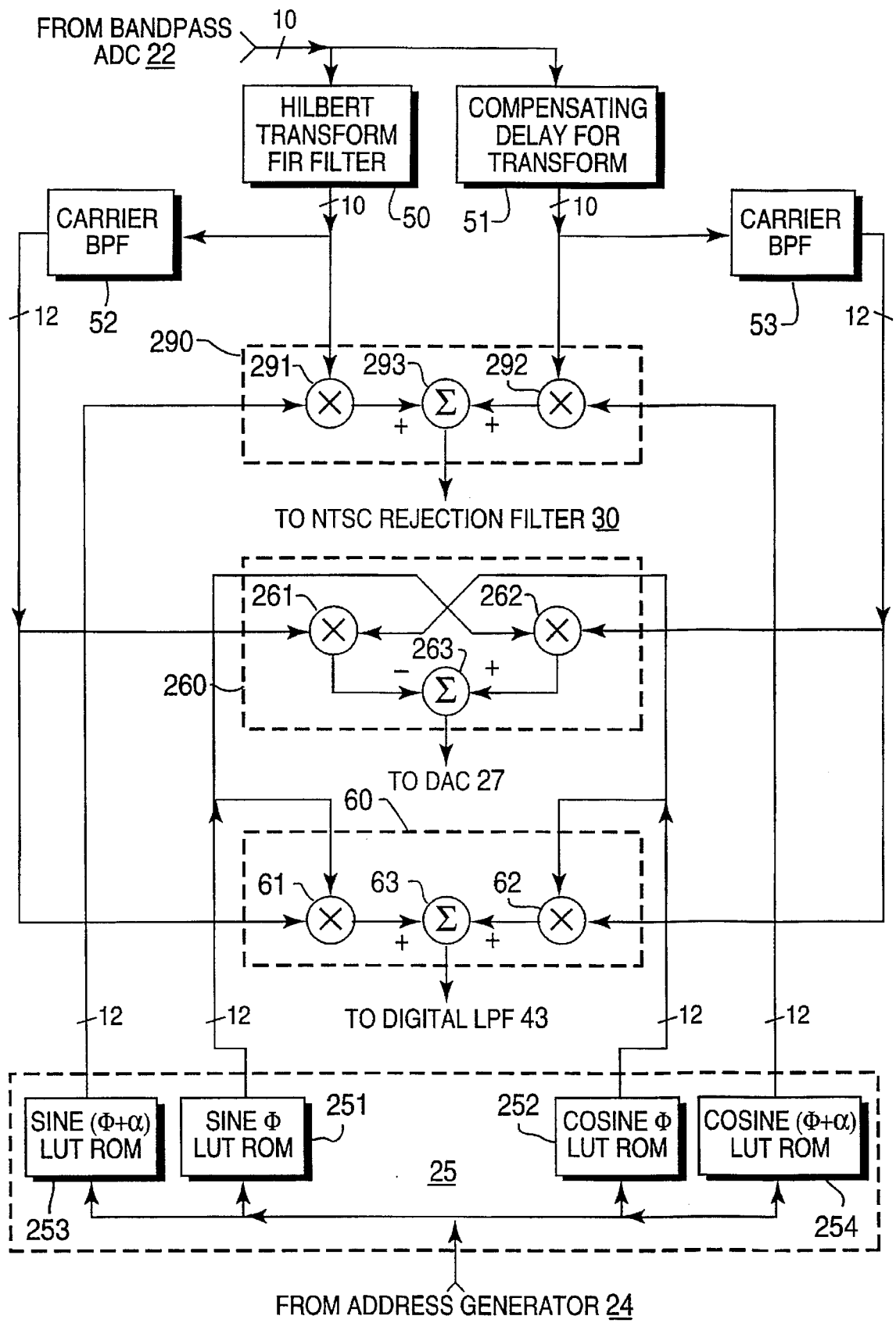

FIG. 5 shows another form portions of the synchrodyne circuitry 2 can take, which form differs from those shown in FIGS. 2 and 3 in the following respects. The ROM circuitry 250 differs from the ROM circuitry 25 in that it further includes another component read-only memory 253 storing a sin $(\Phi\_+\_\alpha)$ look-up table and still another read-only memory 254 storing a cos $(\Phi\_+\_\alpha)$ look-up table. The digital multiplier 291 receives its multiplier signal from the ROM 253, rather than from the ROM 251; and the digital multiplier 292 receives its multiplier signal from the ROM 254, rather than from the ROM 252. The digitized final IF signal from the ADC 22 is applied, via a wired connection without substantial delay, as input signal to the Hilbert transform FIR filter 50; and the response of the filter 50 is applied, via a wired connection without substantial delay, to the digital multiplier 291 as its multiplicand input signal. The digitized final IF signal from the ADC 22 is applied, via a wired connection without substantial delay, as input signal to the digital delay line 51; and the response of the delay line 51, via a wired connection without substantial delay, to the digital multiplier 291 as its multiplicand input signal.

That is, FIG. 5 differs from FIG. 2 in that the delay lines 54 and 55 are replaced by respective wired connections. Instead of using the delay lines 54 and 55 for delaying the multiplicand signals applied to the digital multipliers 291 and 292, the multiplicand signals are advanced in time by taking them from the sin $(\Phi\_+\_\alpha)$ and cos $(\Phi\_+\_\alpha)$ look-up tables stored in the ROMs 253 and 254, rather than from the sin $\Phi$ and cos $\Phi$ look-up tables stored in the ROMs 251 and 252. FIG. 5 differs from FIG. 3 in that the digital delay line 59 is replaced by a wired connection. Instead of using the delay line 59 for delaying the multiplicand signals applied to the digital multipliers 291 and 292, the multiplicand signals are advanced in time by taking them from the sin $(\Phi\_+\_\alpha)$ and cos $(\Phi\_+\_\alpha)$ look-up tables stored in the ROMs 253 and 254. In special cases where $\_\alpha$ is 90°, the ROMs 253 and 254 are not required, of course, since the cos $(\Phi\_+\_\alpha)$ and sin $(\Phi\_+\_\alpha)$ values are same as the sin $\Phi$ and cos $\Phi$ values as respectively read from the ROMs 251 and 252.

Figure 6:
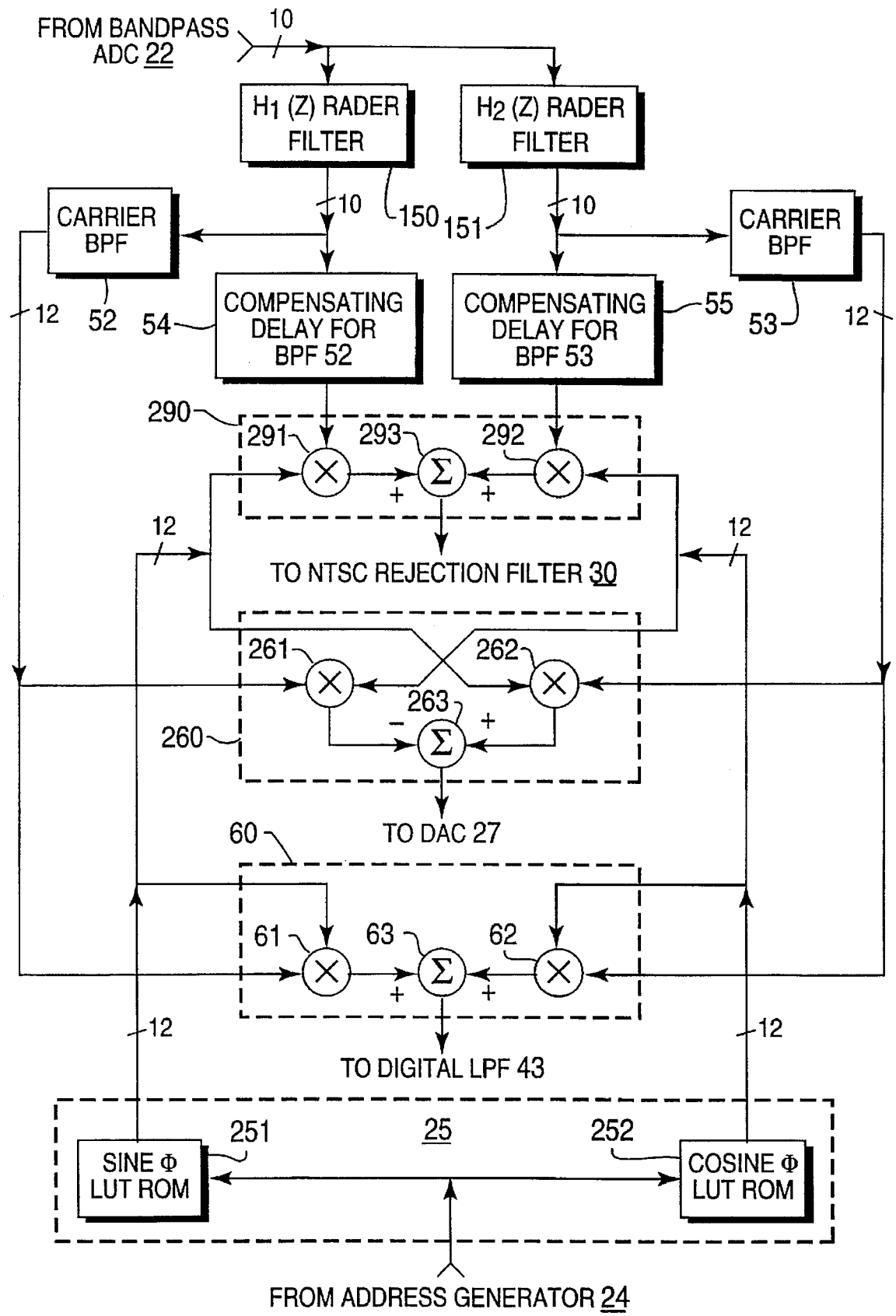

FIG. 6 shows another form portions of the synchrodyne circuitry 2 can take, which form differs from that shown in FIG. 2 in that the digital filter 50 and the digital delay line 51 are replaced by infinite-impulse-response (IIR) digital filters 150 and 151, respectively. The IIR digital filters 150 and 151 respectively provide the $H_1(z)$ and $H_2(z)$ system functions described by C. M. Rader. The responses of the digital filters 150 and 151 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filters 150 and 151. The responses of the digital filters 150 and 151 are supplied as input signals to digital delay lines 54 and 55, which provide respective compensating delays equal to the latency times of carrier bandpass filters 52 and 53, respectively.

Figure 7:
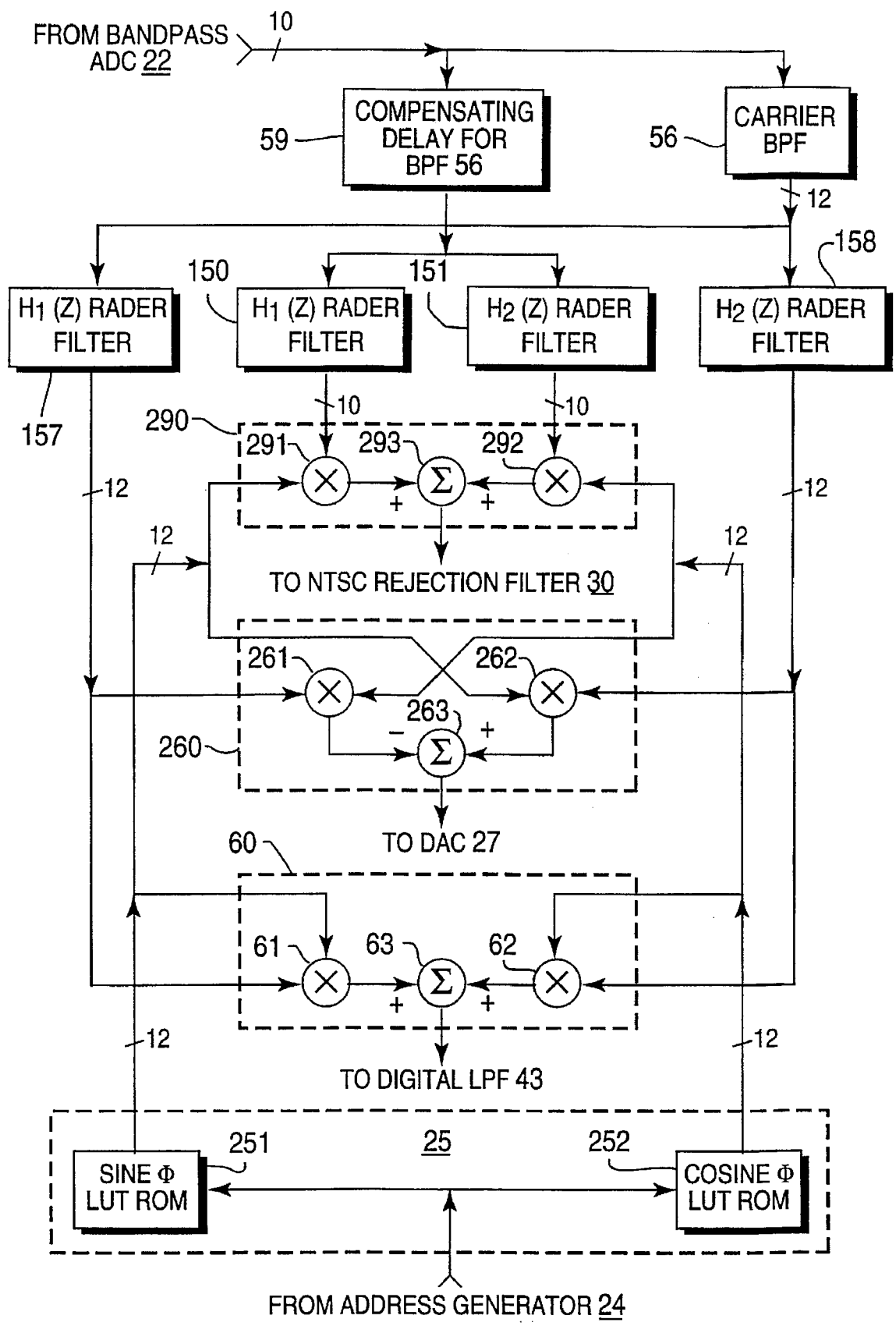

FIG. 7 shows another form portions of the synchrodyne circuitry 2 can take, which form differs from that shown in FIG. 3 in the following respects. The digital filter 50 and the digital delay line 51 are replaced by IIR digital filters 150 and 151, which respectively provide the $H_1(z)$ and $H_2(z)$ system functions described by C. M. Rader. The responses of the digital filters 150 and 151 are supplied as respective multiplicand input signals to the digital multiplier 291 and to the digital multiplier 292 in the fullband digital in-phase synchronous detector 290. The filter 56 response is supplied as a shared input signal to FIR digital filters 157 and 158, which respectively provide the $H_1(z)$ and $H_2(z)$ system functions described by C. M. Rader, for convolution with the filter 56 response. The connections to the quadrature-phase synchronous detector 260 are altered so that the digital multipliers 261 and 262 multiply the responses of the digital filters 157 and 158, respectively, rather than the responses of the carrier bandpass filter 57 and the digital delay line 58. The connections to the narrowband digital in-phase synchronous detector 60 are altered so that the digital multipliers 61 and 62 multiply the responses of the digital filters 157 and 158, respectively, rather than the responses of the carrier bandpass filter 57 and the digital delay line 58.

Figure 8:
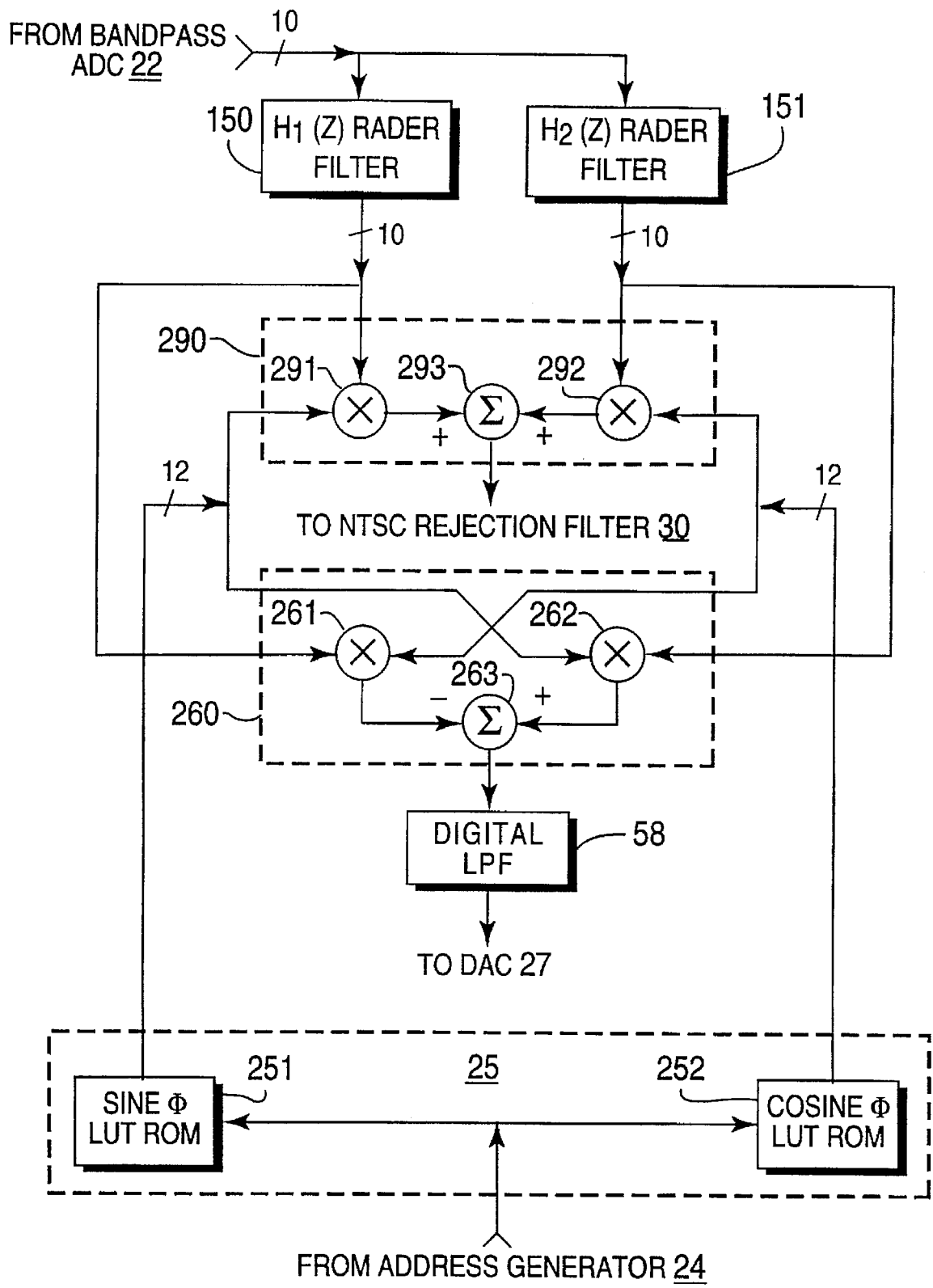

FIG. 8 shows another form portions of the synchrodyne circuitry 2 can take, which form differs from that shown in FIG. 4 in that the digital filter 50 and the digital delay line 51 are replaced by IIR digital filters 150 and 151, which respectively provide the $H_1(z)$ and $H_2(z)$ system functions described by C. M. Rader.

Figure 9:
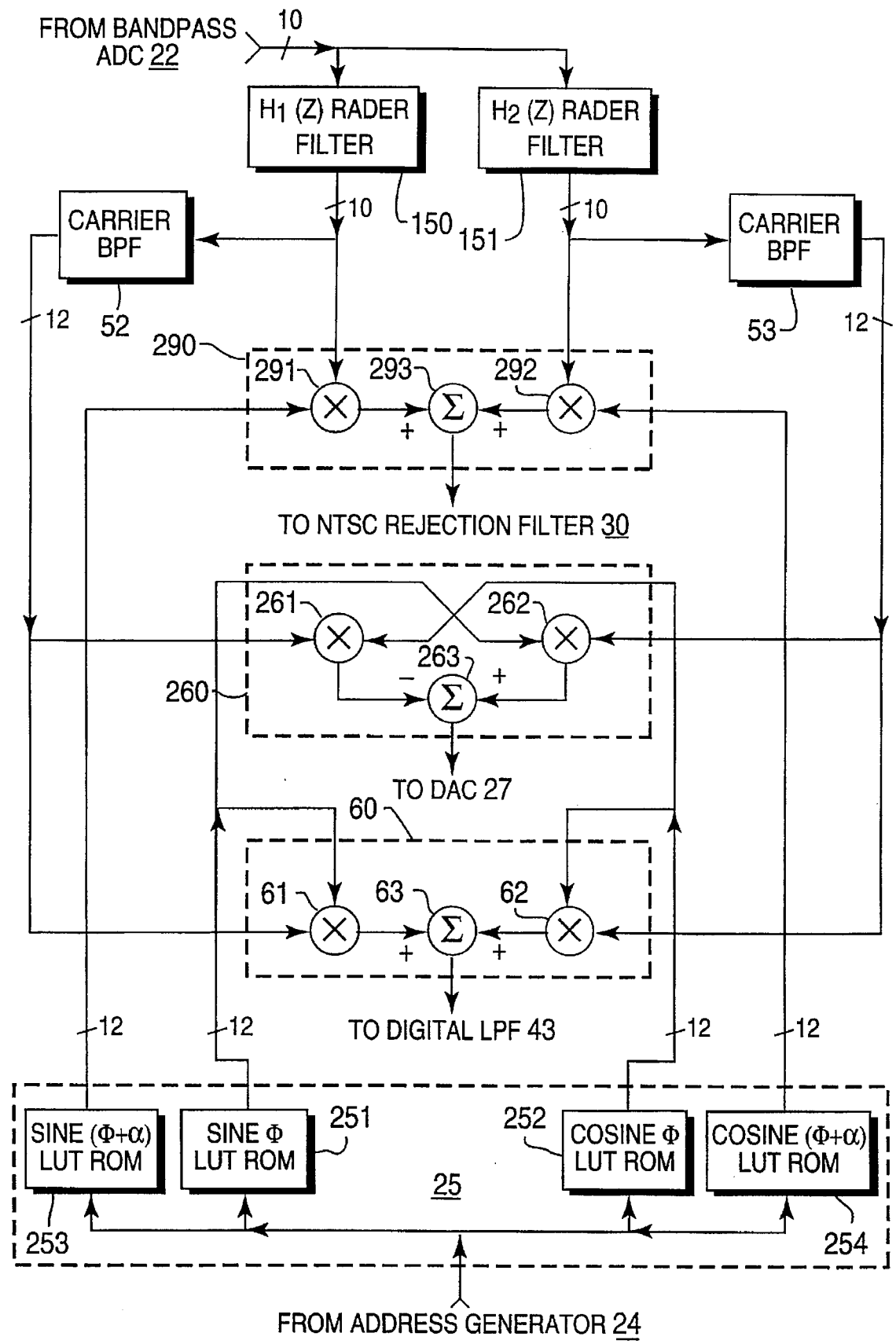

FIG. 9 shows another form portions of the synchrodyne circuitry 2 can take, which form differs from that shown in FIG. 5 in that the digital filter 50 and the digital delay line 51 are replaced by IIR digital filters 150 and 151, which respectively provide the $H_1(z)$ and $H_2(z)$ system functions described by C. M. Rader.

Other pairs of all-pass digital filters, which exhibit a constant $\pi/2$ difference in phase response for the digitized bandpass signals are described by T. F. S. Ng in United Kingdom patent application 2 244 410 A published Nov. 27, 1991 and entitled QUADRATURE DEMODULATOR. Ng criticizes the Rader filters, which are recursive filters of infinite impulse response (IIR) type, for their departures from absolute phase linearity. Ng proposes using non-recursive transversal filters of finite impulse response (FIR) type that have kernels symmetrical in terms of amplitude to achieve absolute phase linearity. Ng advocates the digitization of the final IF signal at a multiple of four times the data symbol transmission rate, so the complex digital figure can be realized as two independent feedforward filter sections, one responsive to oddly occurring digital samples and the other responsive to evenly occurring digital samples. Using Ng filters in place of the Rader filters can reduce variation of symbol timing versus a fixed sampling clock, to reduce intersymbol error, particularly when the digitization of the final IF signal is at a low multiple of four times the data symbol transmission rate, such as four times the data symbol transmission rate.

Figure 10:
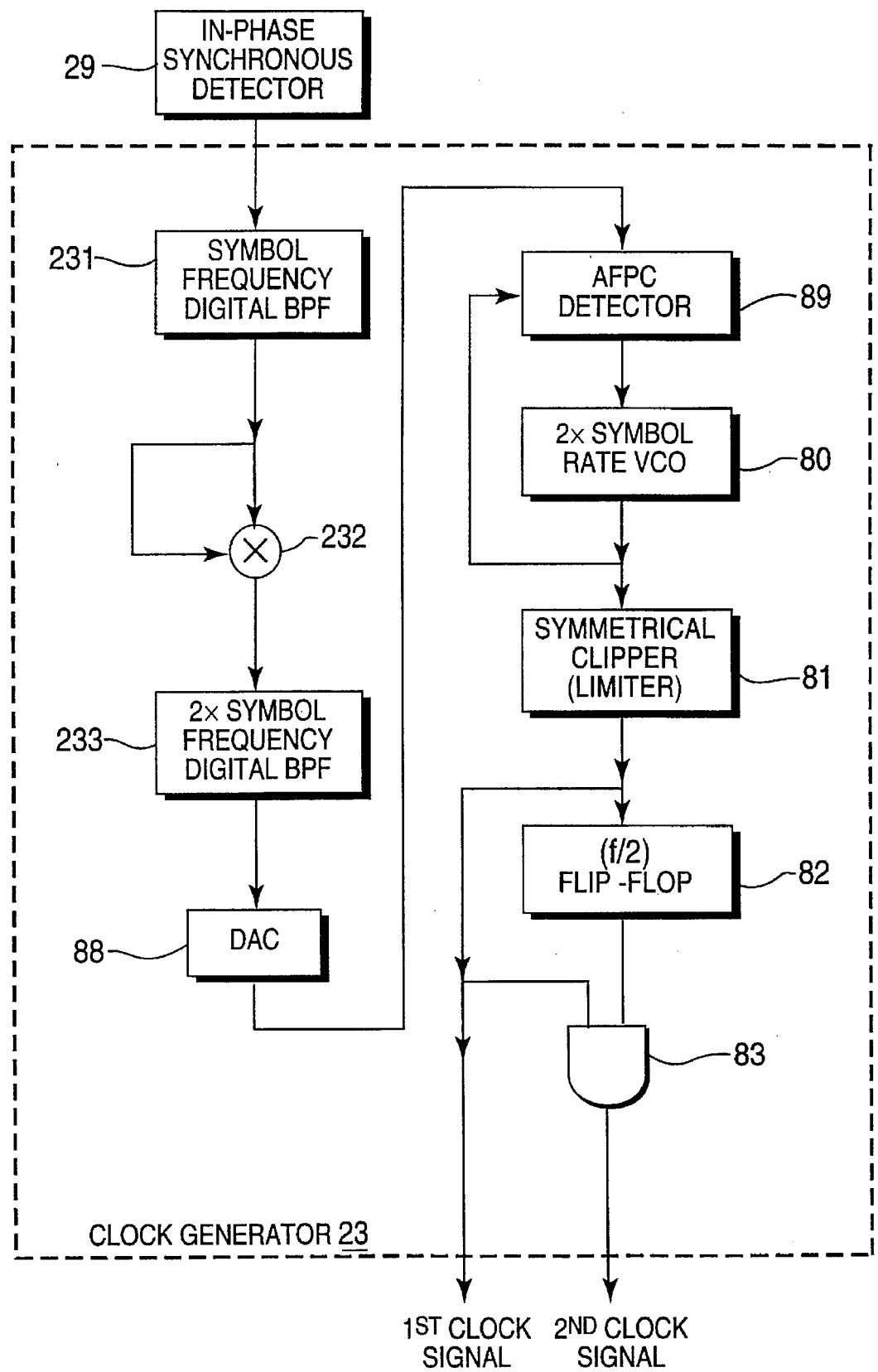
FIG. 10 is a block schematic diagram of a particular form the sample clock generator for the digital circuitry in the FIG. 1 digital HDTV receiver takes, the sample clock generator providing for sampling VSB signal, as downconverted to final intermediate frequencies at a submultiple of symbol rate.

FIG. 10 shows a particular form the sample clock generator 23 for the digital circuitry in the FIG. 1 VSB signal receiver can take for sampling VSB signal, as downconverted to final intermediate frequencies in which the carrier frequency is at a submultiple of symbol rate. A voltage-controlled oscillator 80 generates cissoidal oscillations nominally of 21 MHz frequency. The oscillator 80 is preferably a crystal oscillator capable of frequency control over a relatively narrow range, ±10 Hz or so. A symmetrical clipper or limiter 81 generates a square wave response to these cissoidal oscillations, which is used as a first clock signal. The first clock signal times the sampling of the final IF signal by the ADC 22 as a step in the digitization procedure which follows the initial step of filtering to limit bandwidth. A frequency-divider flip-flop 82 responds to transitions of the first clock signal in a prescribed sense for generating another square wave which an AND circuit 83 ANDs with the first clock signal for generating a second clock signal used in the symbol synchronizer 3 and for sub-sampling the NTSC-rejection filter 30 response 2:1. This 2:1 decimation eliminates the alternate real samples that are nominally zero-valued. The elements 80, 81, 82 and 83 correspond to those elements used in sample clock generators of the VSB receivers described in the inventors' previous applications. The sample clock generator 23 further includes a digital-to-analog converter (DAC) 88, an automatic frequency and phase control detector 89, digital multiplier 232 (or other sample-squaring circuitry) and bandpass digital filters 231 and 233 respectively tuned to the fundamental and the second harmonic of symbol frequency. The cissoidal oscillations from the VCO 80 and a reference 21 MHz carrier supplied from a digital-to-analog converter (DAC) 88 are compared by an AFPC detector 89; and the comparison results are subjected to narrowband lowpass filtering by an AFPC detector 89, to develop an automatic frequency and phase control (AFPC) signal for regulating the frequency of the voltage-controlled oscillator 80 to be exactly twice symbol rate.

FIG. 10 also shows preferred means for controlling the rate of the recurrent pulses in said sample clock signal supplied by the sample clock generator 23. This means, which constitutes elements 231, 232 and 233 in addition to the DAC 88 and the AFPC detector 89, responds to components of said fullband digital in-phase synchronous detection result that are equal to and substantially equal to symbol coding frequency. The reference 21 MHz carrier in digital form that is supplied as input signal to the DAC 88 is generated in response to the strong symbol frequency component of the samples from the fullband in-phase synchronous detector 29, as selected by the bandpass digital filter 231 tuned to the symbol frequency fundamental. The digital multiplier 232 squares the symbol frequency fundamental component selected by the filter 231, and the resulting second harmonic of symbol frequency component is selected by the bandpass digital filter 233 tuned to the second harmonic of the symbol frequency. This selected second harmonic of symbol frequency component is supplied to the DAC 88 for conversion into the reference 21 MHz carrier supplied to the AFPC detector 89. In less-preferred digital HDTV receivers the voltage-controlled oscillator 80 could be replaced by an injection-locked oscillator into which the reference 21 MHz carrier supplied by the DAC 88 is injected directly for locking the frequency of the oscillations.

Figure 11:
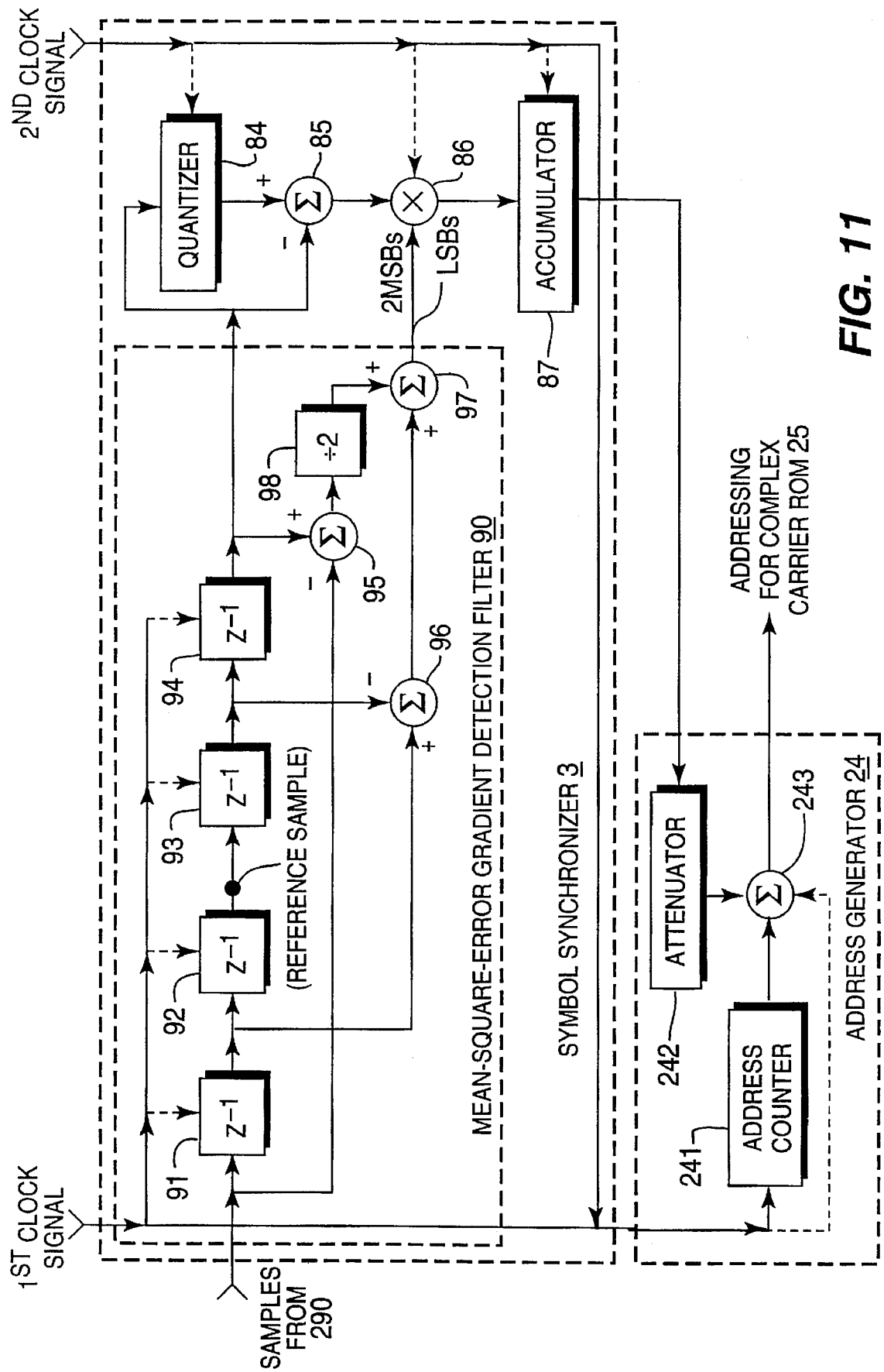
FIG. 11 is a block schematic diagram of a decision-directed symbol synchronizer, as included in a preferred embodiments of the FIG. 1 digital HDTV receiver.

FIG. 11 shows details of the address generator 24 and of the decision-directed symbol synchronizer 3 in a preferred embodiment of the FIG. 1 VSB signal receiver. In the address generator 24 the first clock signal is supplied to the address counter 241, and transitions in the first clock signal are counted by the address counter 241. By way of example, the address counter 24 is a 4-stage binary counter for dividing the 21.08 MHz sample clock frequency by sixteen so the ROM 25 will store descriptions of a 1.32 MHz carrier that is a one-eighth submultiple of symbol frequency. The resulting address count is provided with a several-bit-place extension of ZEROs in the direction of reduced significance, as a first summand input signal for the digital adder 243 that generates the addresses for the ROM 25. A second summand input signal for the digital adder 243 is provided by the output signal from an attenuator 242 for adjusting the amplitude of integrated phase error signal generated by the symbol synchronizer 3; the attenuator 242 is most simply provided by wired bit-place shift.

The symbol synchronizer 3 controls the relative phasing of the complex carrier wave read from the ROM circuitry 25 with respect to the sampling done by the ADC 22. A dynamic adjustment of this phasing is necessary because the VSB signal, as transmitted, has a carrier frequency that is not necessarily an exact multiple of symbol frequency. Therefore, transitions in symbol code can take place at random phasing respective to carrier frequency. If the HDTV signal transmission standards required that the VSB signal be transmitted with a carrier frequency that is an exact multiple of symbol frequency and that symbol transitions be made at prescribed phasings of the carrier frequency, there would be no need for a symbol synchronizer, the inventors point out. The construction of the symbol sychronizer 3 will be considered in more detail, immediately following.

The samples from the in-phase synchronous detector 29, or 290, are applied as input signal to a mean-square-error gradient detection filter 90. The filter 90 is a finite-impulse-response digital filter having a (−½), 1, 0, (−1), (+½) kernel, the operation of which is clocked by the first sampling clock. The filter 90 includes a cascade connection of clocked latches 91, 92, 93 and 94 and further includes digital adder/subtractors 95, 96 and 97. The digital adder/subtractors 95 and 96 are operated unclocked, but the digital adder/subtractor 97 is operated as a clocked element by including a clocked latch at its output, which is clocked by the first sampling clock. Each of the clocked elements 91–94 and 97 exhibits unit clock delay at the 21 mega-sample/second clock rate of the first sampling clock that the ADC 22 uses for input sampling. The adder/subtractor 95 is operated as a subtractor, for subtracting the current input sample supplied to the filter 90 from the input sample supplied four sample periods before. The adder/subtractor 96 is operated as a subtractor, for subtracting, from the input sample supplied one sample period earlier than the current one, the input sample supplied three sample periods earlier. The adder/subtractor 97 is operated as an adder, adding to the difference signal from the subtractor 96 one-half the difference signal from the subtractor 95. The sum signal of the adder 97 is supplied as the filter 90 response.

The samples from the in-phase synchronous detector 290, as delayed by the cascade connection of the clocked latches 91, 92, 93 and 94, are supplied to a quantizer 84, which supplies the quantization level most closely approximated by the sample currently received by the quantizer 84 as input signal. This quantization level has the quantizer 84 input signal subtracted therefrom by a digital adder/subtractor 85, which is operated as a clocked element by including a clocked latch at its output. The filter 90 response is in temporal alignment with the difference signal from the subtractor 85. The difference signal from the subtractor 85 is indicative of the correction required to correct for error in the symbols as detected by the in-phase synchronous detector 290, but does not indicate whether the error arising from the sampling at the VSB signal receiver 5 being misphased is due to sampling too early or too late in time. A digital multiplier 86 multiplies the difference signal from the subtractor 85 by the filter 90 response to resolve this issue. The sign bit and the next most significant bit of the two's complement sum signal from the adder 97 suffice for the multiplication, which permits simplification of the digital multiplier 86 structure. The samples of the product signal from the digital multiplier 86 are indications of symbol timing error supplied to an accumulator 87 for integration. The integrated symbol timing error signal from accumulator 87 is supplied to the attenuator 242. The attenuator 242 generates a symbol phase correction supplied as second summand signal to the digital adder 243 that generates the addresses for the ROM 25 as its sum output signal.

With the general nature of digital HDTV receivers having been described above, the problem of providing automatic gain control to these receivers can now be considered.

An AGC range of 60–90 dB is required of the tuner or radio receiver portion of the HDTV receiver. A plurality of controlled-gain intermediate-frequency amplifier stages must be gain-controlled to achieve so extensive an AGC range. Maintaining phase linearity over a wide range of controlled gain is more easily achieved at frequencies higher than the 1–8 MHz range. So, when the final IF signal is chosen to be in the 1–8 MHz range, it is preferable that the IF amplifiers before the final mixer provide the required AGC range of 60–90 dB. Providing this controlled gain at two frequencies better avoids unwanted regeneration effects, which tend to occur in a high-gain amplifier operating in a single frequency band. The high degree of phase-linearity required of the SAW filtering is easier to achieve at intermediate frequencies higher than the 30–40 MHz range. Accordingly, a triple-conversion tuner is currently preferred.

Figure 12:
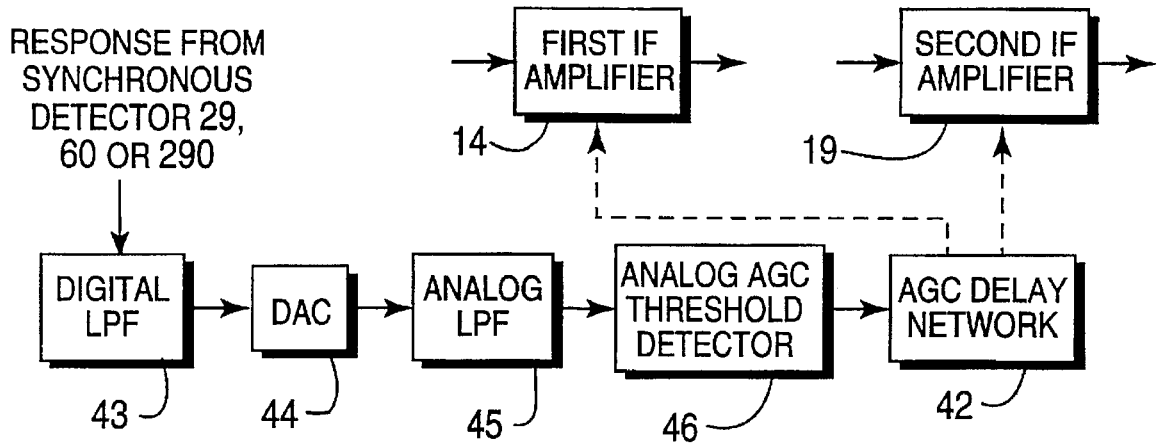
FIG. 12 is a block schematic diagram illustrating an aspect of the invention in which narrowband in-phase synchronous detection of the pilot carrier component of the VSB signal is used for automatic gain control of the intermediate-frequency amplifiers so the symbol levels used in the symbol codes described by the VSB signal are located in the middle of amplitude range bins for a quantizer in the symbol synchronizer.
Figure 18:
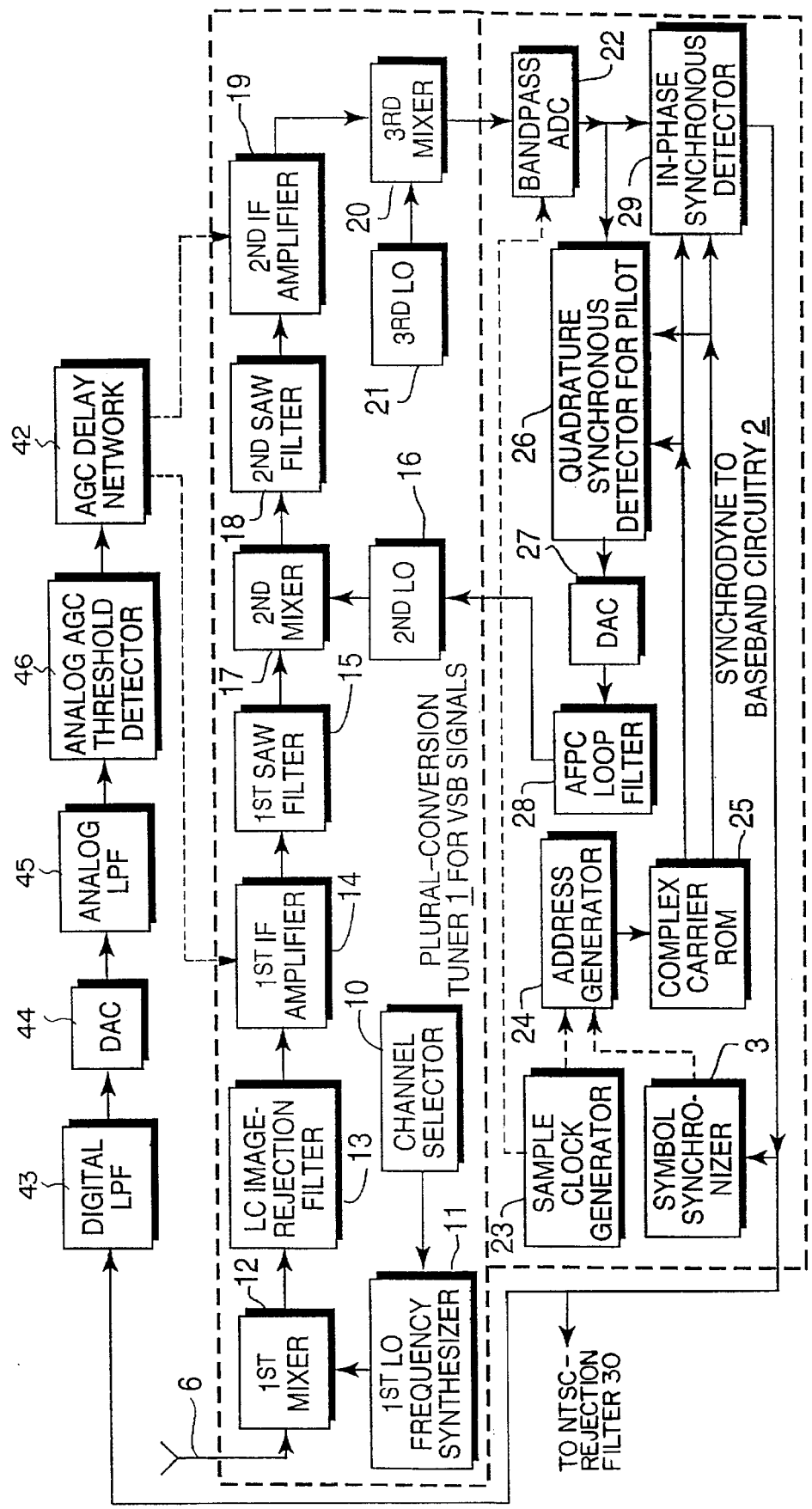
FIG. 18 is a block schematic diagram illustrating how the FIG. 12 AGC circuitry connects to the FIG. 1 digital HDTV circuitry in one embodiment of the invention.

FIG. 12 illustrates arrangements for supplying automatic gain control (AGC) signal to an AGC delay network 42 that supplies gain-control signals to the first IF amplifier 14 and the second IF amplifier 19 of the FIG. 1 VSB digital HDTV receiver for controlling their respective gains. The combined operation of the first IF amplifier 14, the second IF amplifier 19 and the AGC delay network 42 is in accordance with prior-art practice. FIG. 18 is a block schematic diagram illustrating how the FIG. 12 AGC circuitry connects to the FIG. 1 digital HDTV circuitry in one embodiment of the invention. Typically, the practice is as follows.

When the AGC signal indicates only small gain reduction is needed, the AGC delay network 42 applies gain-reduction control signal to the second IF amplifier 19 to reduce its gain, but applies no gain-reduction control signal to the first IF amplifier 14 so its noise figure is kept as low as possible. This provides better signal-to-noise ratio in the signal that the first IF amplifier 14 supplies to the second mixer 17 and in the input signal to the second IF amplifier 19. This results in better signal-to-noise ratio in the signal that the second IF amplifier 19 supplies to the third mixer 20.

When the AGC signal indicates moderate gain reduction is needed, the AGC delay network 42 begins to apply gain-reduction control signal to the first IF amplifier 14 so that the input signal to the second IF amplifier 19 is kept small enough to avoid appreciable non-linearity. The AGC delay network 42 still applies gain-reduction control signal to the second IF amplifier 19 to reduce its gain, but preferably the amount of gain-reduction control signal applied to the second IF amplifier 19 is not changed or is changed less with increased AGC signal.

When the AGC signal indicates large gain reduction is needed, and the capability of the first IF amplifier 14 to afford further signal-to-noise ratio in the signal that the second IF amplifier 19 supplies to the third mixer 20 nears exhaustion, the amount of gain-reduction control signal applied to the second IF amplifier 19 is changed more with increased AGC signal to reduce its gain. The reduction in gain afforded by the first IF amplifier 14 increases very little or not at all, but the reduction in gain afforded by the second IF amplifier 19 increases to maintain prescribed input signal level to the third mixer 20.

When an AGC range of more than 66 dB or so is sought, more than a single amplifier stage in the first IF amplifier 14 and a single amplifier stage in the second IF amplifier 19 must be gain-controlled. Arrangements in which the first IF amplifier 14 contains two gain-controlled amplifier stages in cascade can, by way of example, take the form described by J. R. Harford and H. B. Lee in U.S. Pat. No. 5,331,290 issued 19 Jun. 1994 and entitled VARIABLE GAIN AMPLIFIER. Or, alternatively, similar arrangements of two gain-controlled amplifier stages in cascade can be used in the second IF amplifier 19. Suitable modifications must be made in the AGC delay network 42 to generate properly delayed gain-reduction control signals for the gain-controlled amplifier stages in the first IF amplifier 14 and the second IF amplifier 19, which modifications are within the capability of those of ordinary skill in the art of radio receiver design to make.

What is of particular interest in FIG. 12 is the way in which the AGC input signal is generated for application to the AGC delay network 42. The AGC delay network 42 may include an AGC signal amplifier for the AGC input signal, but with carefully design the need for such AGC signal amplifier can be avoided. The output signal from the in-phase synchronous detector 29, 60 or 290 is supplied to a digital lowpass filter 43. The response of the digital lowpass filter 43 is converted to an analog signal by the digital-to-analog converter (DAC) 44, and the analog output signal of the DAC 44 is lowpass filtered by an analog lowpass filter 45 to generate a response, which response is essentially direct in nature. The filter 45 response is applied to an analog threshold detector 46 for generating an AGC input signal for the AGC delay network 42 only when an AGC threshold is crossed owing to the pilot carrier wave having larger than prescribed value. If the AGC is being relied to set the gain to properly quantize the signal output signal from the in-phase synchronous detector 29 or 290 for implementing "soft-decision" trellis decoding, this AGC threshold is preferably set at a level such that it is crossed when the response of output signal from the in-phase synchronous detector 29, 60 or 290 corresponds to 5/8 of the distance between symbol levels.

The AGC time constant is essentially the sum of the individual type constants of the digital lowpass filter 43 and the analog lowpass filter 45. The AGC time constant can be appreciably shorter than a data line interval, rather than extending over several data line intervals as is customary when AGC is developed by peak detecting match filter response to the data line synchronization code groups. Constructing the digital lowpass filter 43 as a sample averager or other non-recursive filter having finite impulse response simplifies properly relating the response of output signal from the in-phase synchronous detector to the AGC threshold. However, to reduce the amount of digital hardware, the digital lowpass filter 43 can be constructed as a recursive filter having an infinite impulse response. Alternatively or additionally the sampling density of its input signal can be decimated There is still a substantial amount of digital hardware required in the digital lowpass filter 43 if it has an long time constant. An analog lowpass filter 45 can be constructed from one or more resistor-capacitor (RC) L-sections, and longer time constants are more cheaply realized with such filters. The analog lowpass filter 45 is required, at least for suppressing the digital sampling frequency and its sidebands and their harmonics. By averaging out symbol excursions, the digital lowpass filter 43 constrains the dynamic range of the input signals the DAC 44 is called upon to accommodate.

Using the output signal from the narrowband in-phase synchronous detector 60 as the basis for developing AGC is particularly advantageous. Developing AGC proceeding from narrowband synchronous detection of the double-sideband response of narrow bandpass filtered pilot carrier wave is substantially unaffected by Johnson noise. The bandpass filtering reduces the Johnson noise level respective to pilot carrier as the square root of the ratio of full bandwidth of the final IF signal to the narrower bandwidth of the carrier bandpass filter(s), in addition to the quadrature-phase noise being suppressed by synchronous detection. Automatic gain control that is substantially unaffected by noise is advantageous when performing symbol decoding, since the ranges of digital values associated with particular symbols are better defined. The input signal range that the ADC 22 is called upon to digitize must be sufficient to accommodate, without the occurrence of significant clipping, reasonable levels of noise at times adding with the controlled-level final IF signal.

Figure 13:
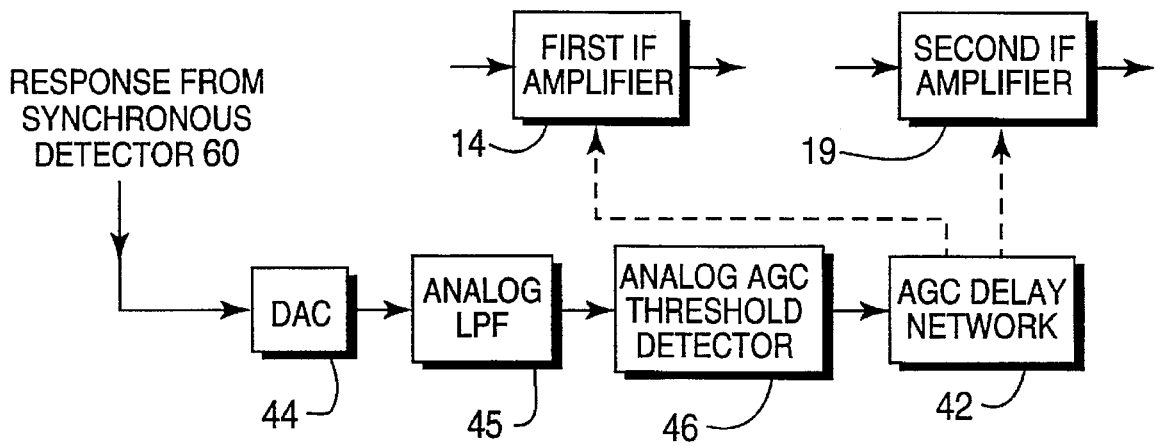
FIG. 13 is a block schematic diagram of an AGC arrangement for the FIG. 1 VSB signal receiver, as modified to use synchronous detection circuitry per FIGS. 2, 3, 4, 5, 6, 7, 8 or 9 in accordance with further embodiments of the invention.

FIG. 13 shows an alternative arrangement for supplying AGC signal to the AGC delay network 42 included in a modification of the FIG. 1 VSB signal receiver per FIGS. 2, 3, 5, 6, 7 or 9. The FIG. 12 arrangement for supplying AGC signal to the AGC delay network 42 is modified in FIG. 13 to dispense with the digital lowpass filter 43 and to apply the output signal from the in-phase synchronous detector 60 directly to the DAC 44 as input signal. The dynamic range of the input signals the DAC 44 is called upon to accommodate is constrained anyway, since the carrier bandpass filters 52 and 53, the carrier bandpass filter 56 or the carrier bandpass filters 57 and 58 suppress symbol excursions.

Figure 14:
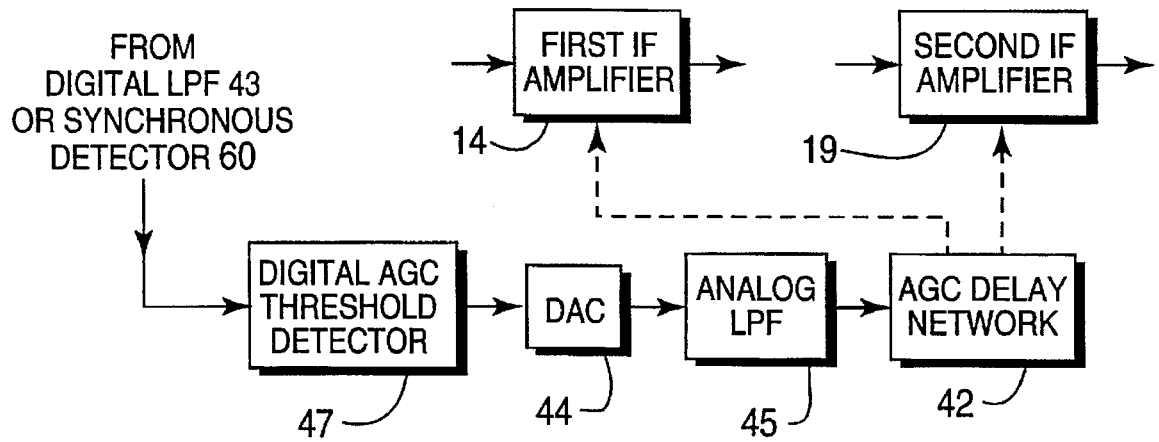
FIG. 14 is a block schematic diagram of still another AGC arrangement in accordance with the invention for the FIG. 1 VSB signal receiver, or that receiver as modified to use synchronous detection circuitry per FIGS. 2, 3, 4, 5, 6, 7, 8 or 9.

FIG. 14 shows a modification that can be made to either of the FIG. 12 and FIG. 13 arrangements for supplying AGC signal to the AGC delay network 42. Rather than the cascade connection of the DAC 44 and the analog lowpass filter 45 being succeeded by an analog threshold detector 46 used to establish an AGC threshold, the DAC 44 is preceded by a digital threshold detector 47 that establishes the AGC threshold and the analog lowpass filter 45 response is applied directly to the AGC delay network 42.

FIG. 15 shows a variation in the way that the VSB AGC signal is applied from the analog threshold detector 46 to the AGC delay network 42 in a television receiver using the second IF amplifier response as input signal to additional receiver circuitry for NTSC television signals, or as input signal to additional receiver circuitry for HDTV signals on a complex-amplitude-modulation (QAM) carrier, or as input signals to both those types of additional receiver circuitry, besides being used in additional receiver circuitry for VSB HDTV signals. The VSB AGC signal from the analog threshold detector is applied to a first input of circuitry 48, which receives at least one other input signal and selects the largest of these signals as its output signal. This type of circuit is sometimes referred to as an analog OR circuit since its construction from unilaterally conductive diodes or the like is similar to an OR gate. A second input of the circuitry 48 can be supplied NTSC AGC signal from additional receiver circuitry for NTSC television signals or QAM AGC signal from additional receiver circuitry for HDTV signals on a complex-amplitude-modulation (QAM) carrier. A QAM AGC signal can be developed from the envelope of the QAM, as described in U.S. Pat. No. 5,235,424 issued 10 Aug. 1993 to T. M. Wagner, entitled AUTOMATIC GAIN CONTROL SYSTEM FOR A HIGH DEFINITION TELEVISION SIGNAL RECEIVER and assigned to General Electric Company. FIG. 15 shows second and third inputs of the circuitry 48 supplied respective AGC input signals from separate ones of additional receiver circuitry for NTSC television signals and additional receiver circuitry for HDTV signals on a complex-amplitude-modulation (QAM) carrier. The response of the circuitry 48 to the largest of these AGC signals, as referred to a reference potential for which no reduction in the gains of the first IF amplifier 14 and the second IF amplifier 19 occurs, is applied to the AGC delay network 42. In order for reduction in the gains of the IF amplifiers 14 and 19 to occur, the departure from the reference potential of the largest AGC input signal applied to the AGC delay network 42 must be of substantial value.

A pilot threshold detector 49 responds to the response of the analog lowpass filter 45 departing from the reference potential in the sense tending to curtail the gains of the IF amplifiers 14 and 19 by more than a threshold value, which threshold value is much smaller than the substantial value at which the gains are actually curtailed, to generate a signal that enables operation of the television receiver for reproducing the television program transmitted on a VSB carrier selected by the tuner 1. Alternatively, it is possible to use the analog threshold detector 46 to generate a signal that enables operation of the television receiver for reproducing the television program transmitted on a VSB carrier selected by the tuner 1. That is either the analog threshold detector 46 or the pilot threshold detector 49 can be used as means for detecting when narrow-band-filtered synchronous detection result is of a level indicative of the reception of VSB signals that include a pilot carrier.

FIG. 16 shows in greater detail arrangements for supplying AGC signal to the AGC delay network 42 per FIG. 14. A source 100 of the wired value of the prescribed AGC threshold and of wired values of the prescribed bin boundaries for symbol levels in the response of the synchronous detector 290 of the pilot level and of. The wired values of the prescribed bin boundaries for symbol levels are supplied to the quantizer 84 of FIG. 11. The wired value of the prescribed AGC threshold in the response of the synchronous detector 60 is presumed to be the same in the response of the synchronous detector 290; if not and the response of the synchronous detector 60 is applied to the input of the digital lowpass filter 43 to provide the basis for developing VSB AGC voltage, the source 100 still supplies a suitably scaled prescribed digital AGC threshold to the digital AGC threshold detector 47

The digital AGC threshold detector 47 is shown in FIG. 16 to comprise a digital subtractor 471 of 2's-complement type and a two-input digital multiplexer 472 receiving as its control signal the most significant bit (MSB) of the difference output signal from the subtractor 471. The digital subtractor 471 functions as a digital comparator since its difference output signal MSB indicates whether or not the response of the digital lowpass filter 43 fails to be at least the digital AGC threshold specified by the source 100 of wired values. When the MSB is ONE, indicative that the response of the digital lowpass filter 43 fails to be at least the digital AGC threshold, the digital multiplexer 47 is conditioned to select a wired arithmetic zero as input signal for the DAC 44. When the MSB is ZERO, indicative that the response of the digital lowpass filter 43 is at least the digital AGC threshold, the digital multiplexer 47 is conditioned to select the response of the digital lowpass filter 43 as input signal for the DAC 44.

Alternatively, the regulation of the amplitude of the transmitted pilot carrier vis-à-vis symbol code levels facilitates receiver circuitry that infers symbol code levels from pilot carrier gain level.

FIG. 17 shows the narrowband in-phase synchronous detection of the pilot carrier component of the VSB signal being used to regulate the boundaries of amplitude range bins for a quantizer in the symbol synchronizer, when automatic gain control of the intermediate-frequency amplifiers is not controlled by the result of narrowband in-phase synchronous detection, so the quantizer 84 must be of a in which amplitude levels that define amplitude range bin boundaries are changed over time responsive to the nature of the received signal. Digital scaling circuitry 101, which comprises a number of fixed-multiplicand digital multipliers, multiplies the multiplicands by the pilot carrier level described by the response of digital lowpass filter 43, for generating products that define boundary values for the amplitude range bins in the quantizer 84. These boundary values are applied to digital comparators in the quantizer 84 for having the quantizer 84 input signal compared against these values. The continuous availability of the pilot carrier, which has substantial signal energy, facilitates rapid tracking of the decision levels in the quantizer 84 with changes in VSB signal strength.

In the claims which follow, the word "said" is used whenever reference is made to an antecedent, and the word "the" is used for other grammatical purposes, rather to refer back to an antecedent.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for applying automatic gain control to a radio receiver for vestigial sideband (VSB) signals, which VSB signals include a pilot carrier and sidebands generated in response to multiple-level symbol codes descriptive of digital signals, said method comprising the steps of:

converting a selected one of said VSB signals to a intermediate-frequency signal in which said pilot carrier is at a prescribed frequency;

synchronously detecting said intermediate-frequency signal in the phasing of said pilot carrier to obtain a synchronous detection result that reproduces said symbol codes in changes of its amplitude, superposed on a substantially zero-frequency component;

lowpass filtering said synchronous detection result to recover said substantially zero-frequency component;

generating an automatic gain control signal responsive to the amount that said substantially zero-frequency component exceeds a prescribed threshold value; and reducing the gain of said intermediate-frequency signal in response to said automatic gain control signal.

2. A method for applying automatic gain control to a radio receiver as set forth in claim 1 further comprising the steps of:

quantizing said synchronous detection result to obtain a quantizer response that reproduces said symbol codes, the boundaries between quantization levels being in prescribed scaling to said prescribed threshold value; and decoding said symbol codes.

3. A method for applying automatic gain control to a radio receiver for vestigial sideband (VSB) signals, which VSB signals include a pilot carrier and sidebands generated in response to multiple-level symbol codes, said method comprising the steps of:

converting a selected one of said VSB signals to a intermediate-frequency signal in which said pilot carrier is at a prescribed frequency;

bandpass filtering said intermediate-frequency signal, to separate said pilot carrier contained within said intermediate-frequency signal from said sidebands;

synchronously detecting said pilot carrier separated from said intermediate-frequency signal, to obtain a first synchronous detection result that contains a substantially zero-frequency component;

generating an automatic gain control signal responsive to the amount that said substantially zero-frequency component of said first synchronous detection result exceeds a prescribed threshold value; and reducing the gain of said intermediate-frequency signal in response to said automatic gain control signal.

4. A method for applying automatic gain control to a radio receiver, as set forth in claim 3, further comprising the steps of:

synchronously detecting said intermediate-frequency signal in the phasing of said pilot carrier to obtain a second synchronous detection result that reproduces said symbol codes in changes of its amplitude, superposed on a substantially zero-frequency component;

quantizing said second synchronous detection result to obtain a quantizer response that reproduces said symbol codes, the boundaries between quantization levels being in prescribed scaling to said prescribed threshold value; and decoding said symbol codes.

5. A radio receiver for vestigial sideband (VSB) signals, which VSB signals include a pilot carrier and sidebands generated in response to symbol codes descriptive of digital signals, said radio receiver utilizing a number at least one of intermediate-frequency bands after utilizing a reception-frequency band for originally receiving said VSB signals, said radio receiver comprising:

respective circuitry for converting a selected one of said VSB signals in each of said reception-frequency and intermediate-frequency bands utilized within said radio receiver, except the final intermediate-frequency band last utilized within said radio receiver, to the intermediate-frequency band next utilized;

a respective intermediate-frequency amplifier for each said intermediate-frequency band, including at least a final intermediate-frequency amplifier which supplies a final intermediate-frequency signal in said final intermediate-frequency band in ultimate response to the selected one of said VSB signals, said final intermediate-frequency signal including a translated-in-frequency response to said pilot carrier, at least one said intermediate-frequency amplifier having gain thereof controlled by a respective gain-control signal;

a synchronous detector for generating a synchronous detector response including a substantially zero-frequency response to said translated-in-frequency response to said pilot carrier;

a filter for selecting, from said synchronous detector response, the substantially zero-frequency response to said translated-in-frequency response to said pilot carrier;

a threshold detector for developing an automatic gain control signal responsive to said substantially zero-frequency response to said translated-in-frequency response to said pilot carrier exceeding an AGC threshold value; and an AGC delay network responsive to said automatic gain control signal for generating said respective gain-control signal for each said intermediate-frequency amplifier having the gain thereof controlled by its said respective gain-control signal.

6. A radio receiver for vestigial sideband (VSB) signals, which VSB signals include a pilot carrier and sidebands generated in response to symbol codes descriptive of digital signals, said radio receiver comprising:

a first mixer for converting radio-frequency VSB signals to first intermediate-frequency VSB signals;

a cascade connection of intermediate-frequency amplifier stages for supplying final intermediate-frequency VSB signals in response to receiving said first intermediate-frequency VSB signals, at least two of which intermediate-frequency amplifier stages provide gain each in an amount controlled by a respective gain control signal;

a delayed AGC network responsive to an AGC signal for supplying said respective gain control signals to said intermediate-frequency amplifier stages that provide gain each in an amount controlled by its said respective gain control signal, said AGC signal at least at selected times corresponding to a VSB AGC signal;

synchronous detection circuitry responsive to said final intermediate-frequency VSB signals for synchronously detecting said pilot carrier therein to generate a substantially zero-frequency component of synchronous detection response and for synchronously detecting said sidebands therein to generate a signal component of synchronous detection response the amplitude variations of which changes in accordance with said symbol codes descriptive of digital signals;

an AGC threshold detector for generating said VSB AGC signal responsive to said substantially zero-frequency component of synchronous detection response exceeding an AGC threshold value; and a quantizer for reproducing said symbol codes responsive to said signal component of synchronous detection response, said quantizer having amplitude bin boundaries in prescribed ratios to said AGC threshold value.

7. A radio receiver as set forth in claim 6, wherein said final intermediate-frequency VSB signals are converted in frequency from said first intermediate-frequency VSB signals.

8. A radio receiver as set forth in claim 6, further comprising:

a second mixer for converting said first intermediate-frequency VSB signals as amplified by an earlier one of said intermediate-frequency amplifier stages for supplying said final intermediate-frequency VSB signals as input signal to the succeeding one of said intermediate-frequency amplifier stages for further amplification.

9. A radio receiver as set forth in claim 6, wherein said synchronous detection circuitry comprises:

a wideband synchronous detector responsive to said final intermediate-frequency VSB signals for synchronously detecting said final intermediate-frequency VSB signals in their entirety to obtain a wideband synchronous detection result that reproduces said symbol codes in changes of its amplitude, superposed on a substantially zero-frequency component; and a lowpass filter responsive to said wideband synchronous detection result for separating said substantially zero-frequency component therefrom as a lowpass filter response, said lowpass filter response being applied to said AGC threshold detector for generating said VSB AGC signal responsive to said lowpass filter response exceeding said AGC threshold value.

10. A radio receiver as set forth in claim 6, wherein said delayed AGC network is responsive to said VSB AGC signal applied thereto in analog form, and wherein said synchronous detection circuitry comprises:

a wideband synchronous detector responsive to said final intermediate-frequency VSB signals for synchronously detecting said final intermediate-frequency VSB signals in their entirety to obtain a wideband synchronous detection result that reproduces in digital samples said symbol codes in changes of the amplitudes of said wideband synchronous detection result, superposed on a substantially zero-frequency component; and a digital lowpass filter responsive to said wideband synchronous detection result for separating digital samples of said substantially zero-frequency component therefrom as a digital lowpass filter response.

11. A radio receiver as set forth in claim 10, wherein said AGC threshold detector is an analog AGC threshold detector applying said VSB AGC signal in analog form to said delayed AGC network, and wherein said synchronous detection circuitry further comprises:

a digital-to-analog converter generating said substantially zero-frequency component of synchronous detection response by converting said digital samples in said digital lowpass filter response; and an analog lowpass filter, for applying its response said substantially zero-frequency component of synchronous detection response from said digital-to-analog converter to said analog AGC threshold detector as an input signal thereto.

12. A radio receiver as set forth in claim 11, further comprising:

means for detecting when said analog lowpass filter response is of a level indicative of the reception of said VSB signals that include a pilot carrier.

13. A radio receiver as set forth in claim 10, wherein said AGC threshold detector is a digital AGC threshold detector for generating digital samples of said VSB AGC signal, and wherein said synchronous detection circuitry further comprises:

a digital-to-analog converter generating said substantially zero-frequency component of synchronous detection response by converting said digital samples generated by said digital AGC threshold detector; and an analog lowpass filter, for applying said substantially zero-frequency component of synchronous detection response from said digital-to-analog converter to said delayed AGC network as said VSB AGC signal in analog form.

14. A radio receiver as set forth in claim 6, wherein said synchronous detection circuitry comprises:

a wideband synchronous detector responsive to said final intermediate-frequency VSB signals for synchronously detecting said final intermediate-frequency VSB signals in their entirety to obtain a wideband synchronous detection result that reproduces said symbol codes in changes of its amplitude, superposed on a substantially zero-frequency component;

bandpass filtering for selecting from said final intermediate-frequency VSB signals said pilot carrier therein and suppressing said sidebands generated in response to symbol codes descriptive of digital signals, thereby supplying at least one bandpass filtering response; and a narrowband synchronous detector receptive of at least one said bandpass filtering response, for synchronously detecting said pilot carrier selected by said bandpass filtering to obtain digital samples of a narrowband synchronous detection result that is proportional to said substantially zero-frequency component in said wideband synchronous detection result, said narrowband synchronous detection result being applied to said AGC threshold detector for generating said VSB AGC signal responsive to said narrowband synchronous detection result exceeding said AGC threshold value.

15. A radio receiver as set forth in claim 14, wherein said AGC threshold detector is an analog AGC threshold detector applying said VSB AGC signal in analog form to said delayed AGC network, and wherein said synchronous detection circuitry further comprises:

a digital-to-analog converter generating said substantially zero-frequency component of synchronous detection response by converting said digital samples in said narrowband synchronous detection result; and an analog lowpass filter, for applying said substantially zero-frequency component of synchronous detection response from said digital-to-analog converter to said analog AGC threshold detector as an input signal thereto.

16. A radio receiver as set forth in claim 15, further comprising:

means for detecting when said analog lowpass filter response is of a level indicative of the reception of said VSB signals that include a pilot carrier.

17. A radio receiver as set forth in claim 13, wherein said AGC threshold detector is a digital AGC threshold detector for generating digital samples of said VSB AGC signal, and wherein said synchronous detection circuitry further comprises:

a digital-to-analog converter generating said substantially zero-frequency component of synchronous detection response by converting said digital samples generated by said digital AGC threshold detector; and an analog lowpass filter, for applying said substantially zero-frequency component of synchronous detection response from said digital-to-analog converter to said delayed AGC network as said VSB AGC signal in analog form.

18. A method for applying automatic gain control to a radio receiver for amplitude-modulated signals comprising at least one sideband of a suppressed carrier and a pilot carrier, which pilot carrier has a frequency that is the same as said suppressed carrier and has an amplitude independent of the amount of amplitude modulation provided by said at least one sideband of said suppressed carrier, said method comprising steps of:

converting a selected one of said amplitude-modulated signals to a intermediate-frequency signal in which said pilot carrier is at a prescribed frequency;

synchronously detecting said intermediate-frequency signal in the phasing of said pilot carrier to obtain a synchronous detection result that includes a substantially zero-frequency component;

lowpass filtering said synchronous detection result to recover said substantially zero-frequency component;

generating an automatic gain control signal responsive to the amount that said substantially zero-frequency component exceeds a prescribed threshold value; and reducing the gain of said intermediate-frequency signal in response to said automatic gain control signal.

19. A method as set forth in claim 18, for applying automatic gain control to a radio receiver which method further comprises steps of:

for amplitude modulated signals that are descriptive of digital symbol codes, quantizing said synchronous detection result to obtain a quantizer response that reproduces said symbol codes, the boundaries between quantization levels being in prescribed scaling to said prescribed threshold value; and decoding said symbol codes.

20. A method for applying automatic gain control to a radio receiver for amplitude-modulated signals comprising at least one sideband of a suppressed carrier and a pilot carrier, which pilot carrier has a frequency that is the same as said suppressed carrier and has an amplitude independent of the amount of amplitude modulation provided by said at least one sideband of said suppressed carrier, said method comprising steps of:

converting a selected one of said amplitude-modulated signals to a intermediate-frequency signal in which said pilot carrier is at a prescribed frequency;

bandpass filtering said intermediate-frequency signal, to separate said pilot carrier contained within said intermediate-frequency signal from each said at least one sideband of said suppressed carrier;

synchronously detecting said pilot carrier separated from said intermediate-frequency signal, to obtain a first synchronous detection result that contains a substantially zero-frequency component;

generating an automatic gain control signal responsive to the amount that said substantially zero-frequency component of said first synchronous detection result exceeds a prescribed threshold value; and reducing the gain of said intermediate-frequency signal in response to said automatic gain control signal.

21. A method as set forth in claim 20, for applying automatic gain control to a radio receiver which method further comprises steps of:

synchronously detecting said intermediate-frequency signal in the phasing of said pilot carrier to obtain a second synchronous detection result that reproduces said symbol codes in changes of its amplitude, superposed on a substantially zero-frequency component;

for amplitude modulated signals that are descriptive of digital symbol codes, quantizing said second synchronous detection result to obtain a quantizer response that reproduces said symbol codes, the boundaries between quantization levels being in prescribed scaling to said prescribed threshold value; and decoding said symbol codes.

22. A radio receiver for amplitude-modulated signals comprising at least one sideband of a suppressed carrier and a pilot carrier, which pilot carrier has a frequency that is the same as said suppressed carrier and has an amplitude independent of the amount of amplitude modulation provided by said at least one sideband of said suppressed carrier,_said radio receiver utilizing a number at least one of intermediate-frequency bands after utilizing a reception-frequency band for originally receiving said amplitude-modulated signals, said radio receiver comprising:

respective circuitry for converting a selected one of said amplitude-modulated signals in each of said reception-frequency and intermediate-frequency bands utilized within said radio receiver, except the final intermediate-frequency band last utilized within said radio receiver, to the subsequently utilized intermediate-frequency band;

a respective intermediate-frequency amplifier for each said intermediate-frequency band, including at least a final intermediate-frequency amplifier which supplies a final intermediate-frequency signal in said final intermediate-frequency band in ultimate response to the selected one of said amplitude-modulated signals, said final intermediate-frequency signal including a translated-in-frequency response to said pilot carrier, at least one said intermediate-frequency amplifier having gain thereof controlled by a respective gain-control signal;

a synchronous detector for generating a synchronous detector response including a substantially zero-frequency response to said translated-in-frequency response to said pilot carrier;

a filter for selecting, from said synchronous detector response, the substantially zero-frequency response to said translated-in-frequency response to said pilot carrier;

a threshold detector for developing an automatic gain control signal responsive to said substantially zero-frequency response to said translated-in-frequency response to said pilot carrier exceeding an AGC threshold value; and an AGC delay network responsive to said automatic gain control signal for generating said respective gain-control signal for each said intermediate-frequency amplifier having the gain thereof controlled by its said respective gain-control signal.

* * * * *